US011271528B2

(12) United States Patent
Miyazaki

(10) Patent No.: US 11,271,528 B2
(45) Date of Patent: Mar. 8, 2022

(54) CONTROL CIRCUIT AND CONTROL METHOD OF THE SAME

(71) Applicant: SONY SEMICONDUCTOR SOLUTIONS CORPORATION, Kanagawa (JP)

(72) Inventor: Daisuke Miyazaki, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 405 days.

(21) Appl. No.: 16/328,768

(22) PCT Filed: Jul. 31, 2017

(86) PCT No.: PCT/JP2017/027614
§ 371 (c)(1),
(2) Date: Feb. 27, 2019

(87) PCT Pub. No.: WO2018/066215
PCT Pub. Date: Apr. 12, 2018

(65) Prior Publication Data
US 2021/0194435 A1 Jun. 24, 2021

(30) Foreign Application Priority Data
Oct. 3, 2016 (JP) .............................. JP2016-195893

(51) Int. Cl.
H03F 1/26 (2006.01)
H03F 3/183 (2006.01)
(Continued)

(52) U.S. Cl.
CPC ............... H03F 1/26 (2013.01); H03F 3/183 (2013.01); H04R 5/04 (2013.01); H04S 1/007 (2013.01);
(Continued)

(58) Field of Classification Search
CPC combination set(s) only.
See application file for complete search history.

(56) References Cited

U.S. PATENT DOCUMENTS 5,946,334 A * 8/1999 Ema .................... H01S 5/06835
372/38.01
2009/0058549 A1 3/2009 Kost
2013/0187715 A1 7/2013 Nagashima

FOREIGN PATENT DOCUMENTS

JP 2004-048333 A 2/2004
JP 2011-082930 A 4/2011
JP 2013-153318 A 8/2013

OTHER PUBLICATIONS

International Search Report and Written Opinion of PCT Application No. PCT/JP2017/027614, dated Oct. 17, 2017, 08 pages of ISRWO.

* cited by examiner

Primary Examiner — Duc Nguyen
Assistant Examiner — Assad Mohammed
(74) Attorney, Agent, or Firm — Chip Law Group

(57) ABSTRACT

Noise caused by switching is reduced using a simple configuration in a circuit amplifying a pulse signal using a switching amplifier. A control data output section outputs control data that instructs that a pulse width of each of a pair of pulse signals be modulated. A data replacement section replaces the control data with data for replacement different from the control data in the case where the control data is output that instructs that the modulation leading to approximately a same pulse width for the pair of pulse signals be performed. A pulse width modulation circuit performs the modulation on each of the pair of pulse signals in accordance (Continued)

with the data for replacement. A pair of switching amplifiers amplify the pair of pulse signals that have been subjected to the modulation.

9 Claims, 22 Drawing Sheets

(51) Int. Cl.
*H04R 5/04* (2006.01)
*H04S 1/00* (2006.01)

(52) U.S. Cl.
CPC .... *H03F 2200/03* (2013.01); *H03F 2200/372* (2013.01); *H04S 2400/13* (2013.01)

| CONTROL DATA Ya(t) | ACTION OF DATA REPLACEMENT SECTION |
|---|---|
| S1("0") | REPLACE WITH S2("1") AND OUTPUT AS OUTPUT DATA Za(t) |
| OTHER THAN S1 | OUTPUT Ya(t) AS Za(t) |

| CONTROL DATA YL(t) | ACTION OF DATA REPLACEMENT SECTION (L SIDE) |
|---|---|
| L1("0") OR -YR(t) | REPLACE WITH YL(t) TO WHICH L2 ("1") HAS BEEN ADDED AND OUTPUT AS OUTPUT DATA ZL(t) |
| L1, OTHER THAN -YR(t) | OUTPUT YL(t) AS ZL(t) |

FIG. 19A

| CONTROL DATA YR(t) | ACTION OF DATA REPLACEMENT SECTION (R SIDE) |
|---|---|
| L1("0") OR YL(t) | REPLACE WITH YR(t) TO WHICH L2 ("1") HAS BEEN ADDED AND OUTPUT AS OUTPUT DATA ZR(t) |
| L1, OTHER THAN YL(t) | OUTPUT YR(t) AS ZR(t) |

FIG. 19B

CONTROL CIRCUIT AND CONTROL METHOD OF THE SAME

CROSS REFERENCE TO RELATED APPLICATIONS

This application is a U.S. National Phase of International Patent Application No. PCT/JP2017/027614 filed on Jul. 31, 2017, which claims priority benefit of Japanese Patent Application No. JP 2016-195893 filed in the Japan Patent Office on Oct. 3, 2016. Each of the above-referenced applications is hereby incorporated herein by reference in its entirety.

TECHNICAL FIELD

The present technology relates to a control circuit and a control method of the same and, more particularly, to a control circuit amplifying a pulse signal using a switching amplifier and a control method of the control circuit.

BACKGROUND ART

It has been common to use an analog class-A, class-B, or class-AB amplifier or a digital class-D amplifier to amplify an audio signal in acoustic equipment. Of these, the digital class-D amplifier has been widely known for its compact size and low power consumption as compared to its analog counterparts. This class-D amplifier generally has a PWM (Pulse Width Modulation) circuit and a switching amplifier. The PMW circuit modulates a pulse width of a pulse signal. The switching amplifier amplifies the modulated pulse signal. Two such switching amplifiers are provided for each channel in the case of a differential output, and one switching amplifier is provided for each channel in the case of a single-ended output.

Here, in the case where two or more switching amplifiers are provided, and if edge timings of pulse signals input to the switching amplifiers are the same, a plurality of switching elements (e.g., transistors) in the switching amplifiers are switched at the same time. Then, as a result of this simultaneous switching, currents larger than when the switching timings are different flow momentarily, resulting in noise. For this reason, in order to avoid this simultaneous switching, an amplifier whose PWM circuit generates a plurality of pulse signals having different phases has been proposed (refer, for example, to PTL 1).

CITATION LIST

Patent Literature

[PTL 1]
Japanese Patent Laid-Open No. 2004-48333

SUMMARY

Technical Problem

The above conventional technology permits noise reduction by switching the plurality of switching elements at different timings by using a plurality of pulse signals having different phases. However, this configuration requires addition of an analog circuit for shifting the phases of the pulse signals and other circuits, possibly resulting in increased circuit scale and costs. For example, a CR circuit is used that includes a capacitor and a resistor to shift the phases in the above conventional technology. Thus, the above conventional technology has a problem in that it is difficult to reduce noise while at the same time suppressing an increase in amplifier circuit scale and costs.

The present technology has been devised in light of the foregoing, and it is an object of the present technology to reduce noise caused by switching using a simple configuration in a circuit amplifying a pulse signal using a switching amplifier.

Solution to Problem

The present technology has been devised to solve the above problem, and a first aspect thereof is a control circuit and a control method of the same. The control circuit includes a control data output section, a data replacement section, a pulse width modulation circuit, and a pair of switching amplifiers. The control data output section outputs control data that instructs that a pulse width of each of a pair of pulse signals be modulated. The data replacement section replaces the control data with data for replacement different from the control data in the case where the control data is output that instructs that the modulation leading to approximately a same pulse width for the pair of pulse signals be performed. The pulse width modulation circuit performs the modulation on each of the pair of pulse signals in accordance with the data for replacement. The pair of switching amplifiers amplify the pair of pulse signals that have been subjected to the modulation. This provides an effect of replacing control data that leads to approximately the same pulse width for a pair of pulse signals.

Also, in the first aspect, the control circuit may further include a difference operator, an integration circuit, and a delay section. The difference operator outputs a difference between input data and feedback data as difference data. The integration circuit generates integral data by integrating the difference data. The delay section delays the data for replacement and feeds back the delayed data for replacement to the difference operator as the feedback data. The input data may be quantized data, and the control data output section may re-quantize the integral data and output the re-quantized data to the data replacement section as the control data. This provides an effect of feeding back data for replacement.

Also, in the first aspect, the control data may represent a difference in pulse width between the pair of pulse signals, and the data replacement section may replace the control data with the data for replacement in the case where the control data is output that instructs that the modulation approximately nulling the difference be performed. This provides an effect of replacing control data that approximately nulls the difference in pulse width.

Also, in the first aspect, the pair of switching amplifiers may be provided for all of a plurality of output circuits outputting audio of different channels. This provides an effect of replacing control data in each of the plurality of channels.

Also, in the first aspect, the plurality of output circuits may include a left-channel output circuit outputting left-channel audio and a right-channel output circuit outputting right-channel audio. This provides an effect of replacing control data in each of the left channel and the right channel.

Also, in the first aspect, the control data may represent the pulse width of each of the pair of pulse signals, and one of the pair of switching amplifiers may be provided in one of the plurality of output circuits outputting audio of different channels, and the other of the pair of switching amplifiers may be provided in the output circuit of the plurality of output circuits where the one of the pair of switching amplifiers is not provided. This provides an effect of replacing control data in each of the plurality of channels.

Also, in the first aspect, the data replacement section may output the control data to the pulse width modulation circuit in the case where the control data is output that instructs that the modulation leading to approximately the same pulse width for the pair of pulse signals be performed, and the pulse width modulation circuit may perform the modulation in accordance with the data for replacement or the control data. This provides an effect of performing the modulation using the control data in the case where the control data is not replaced.

Advantageous Effect of Invention

The present technology provides an excellent effect in that noise caused by switching can be reduced by using a simple configuration in a circuit amplifying a pulse signal using a switching amplifier. It should be noted that the effect described here is not necessarily limited and may be any one of the effects described in the present disclosure.

BRIEF DESCRIPTION OF DRAWINGS

FIGS. 19A and 19B represent diagrams illustrating an example of action of the data replacement sections in the second embodiment of the present technology.

DESCRIPTION OF EMBODIMENTS

A detailed description will be given below of modes for carrying out the present technology (hereinafter referred to as "embodiments"). The description will be given in the following order:
1. First Embodiment (Example of Replacing Control Data)
2. Second Embodiment (Example of Replacing Control Data in Stereo Amplifier)

1. First Embodiment

Figure 1:
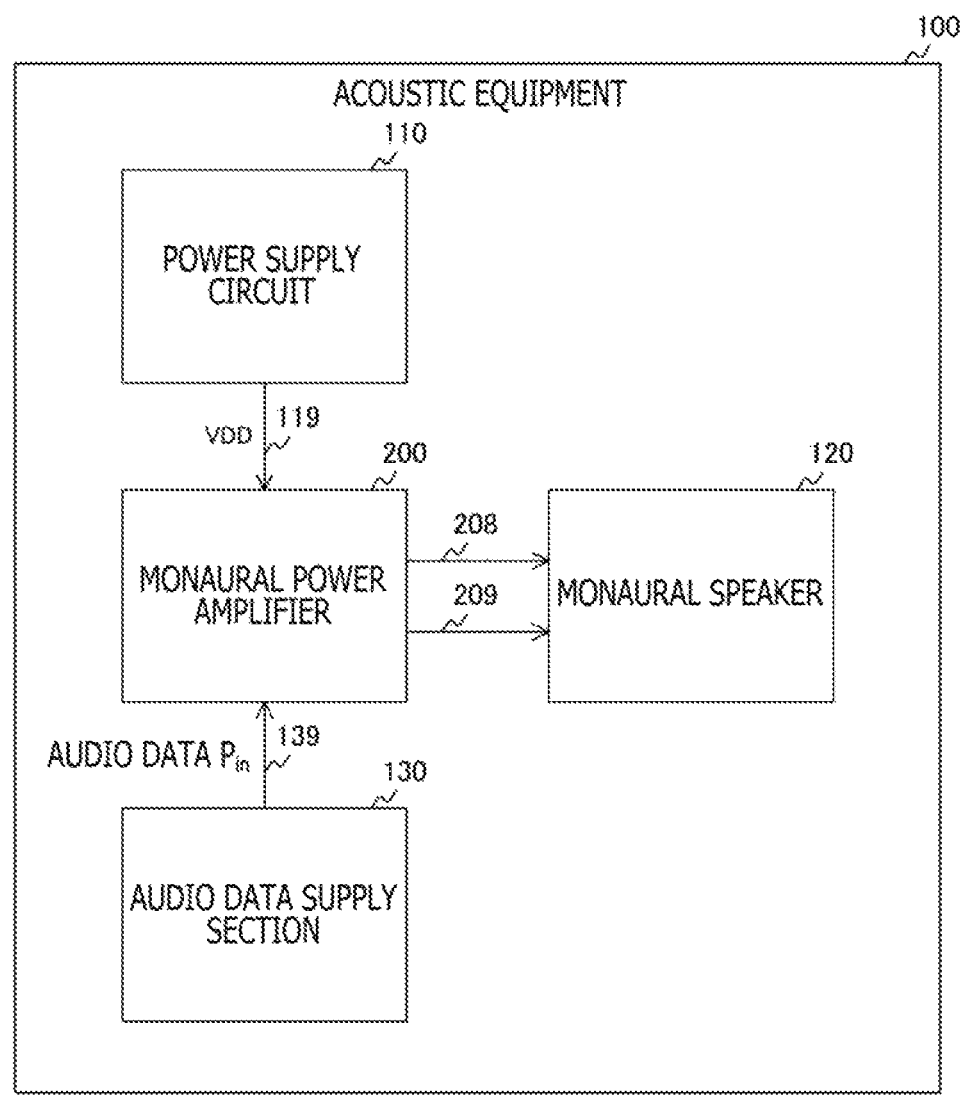
FIG. 1 is a block diagram illustrating a configuration example of acoustic equipment in a first embodiment of the present technology.

[Configuration Example of Acoustic Equipment]
FIG. 1 is a block diagram illustrating a configuration example of acoustic equipment 100 in a first embodiment of the present technology. The acoustic equipment 100 reproduces audio and includes a power supply circuit 110, a monaural speaker 120, an audio data supply section 130, and a monaural power amplifier 200. The acoustic equipment 100 is possibly a mini component, a portable gaming console, a personal computer, or the like.

The power supply circuit 110 supplies a supply voltage VDD to the monaural power amplifier 200 via a power line 119.

The audio data supply section 130 acquires digital audio data $P_{in}$ representing monaural audio and supplies this data to the monaural power amplifier 200 via a signal line 139. For example, an interface, a memory controller, or other device is used as the audio data supply section 130. This audio data supply section 130 receives, for example, the audio data $P_{in}$ from outside the acoustic equipment 100. Alternatively, the audio data supply section 130 reads the audio data $P_{in}$ from a storage device such as non-volatile memory in the acoustic equipment 100.

The monaural power amplifier 200 converts the audio data $P_{in}$ into an analog differential pulse signal through DA (Digital to Analog) conversion and amplifies the pulse signal. The monaural power amplifier 200 supplies the amplified differential pulse signal to the monaural speaker 120 via signal lines 208 and 209. This differential pulse signal includes a pair of pulse signals. The monaural speaker 120 outputs audio whose level is proportional to the difference in pulse width between the differential pulse signals.

It should be noted that although provided in a single piece of equipment, the power supply circuit 110, the monaural speaker 120, the audio data supply section 130, and the monaural power amplifier 200 may be distributed in a plurality of devices or pieces of equipment. For example, the power supply circuit 110, the audio data supply section 130, and the monaural power amplifier 200 may be provided in an amplifier unit, with the monaural speaker 120 provided outside the amplifier unit.

[Configuration Example of Monaural Power Amplifier]

Figure 2:
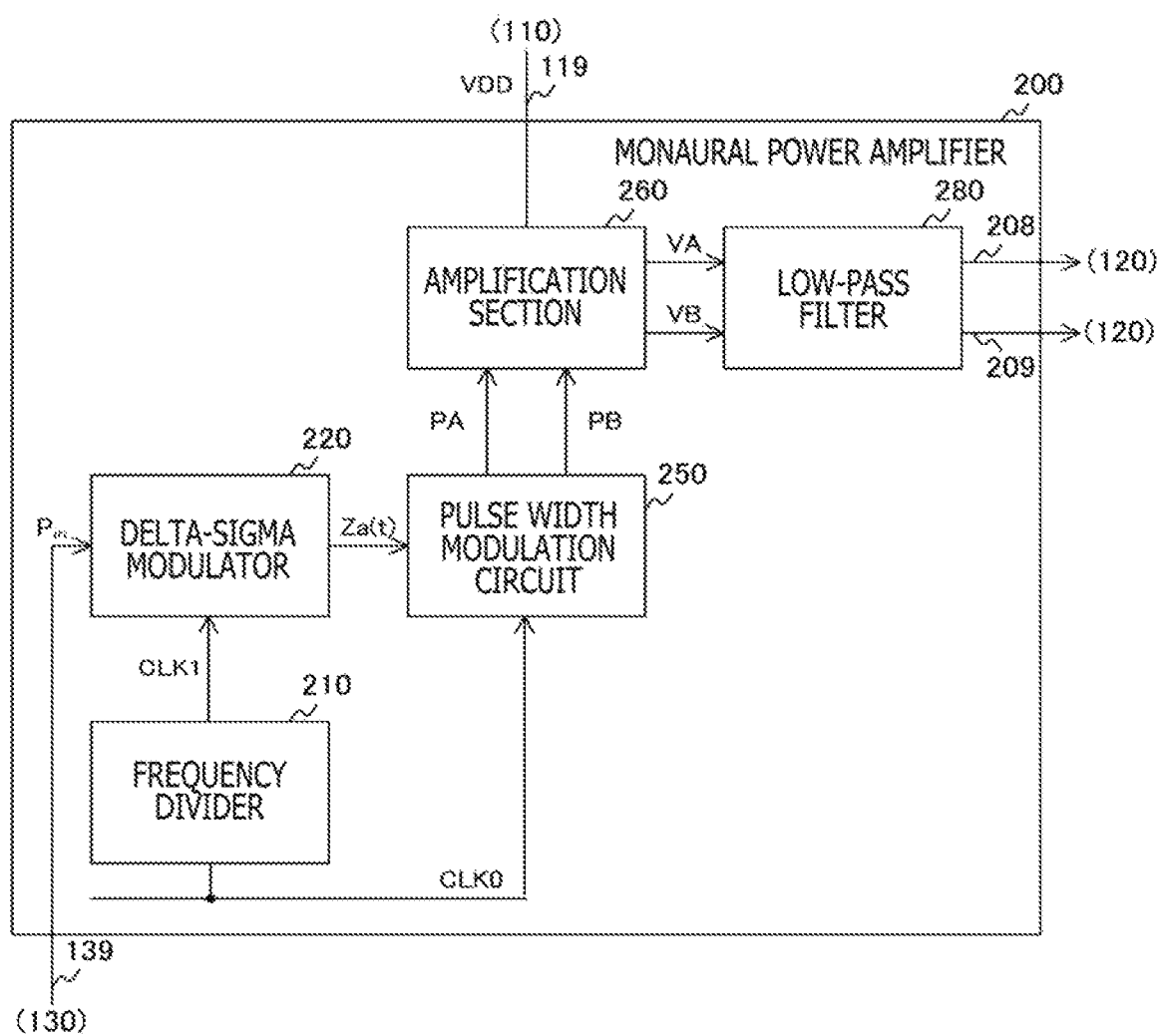
FIG. 2 is a block diagram illustrating a configuration example of a monaural power amplifier in the first embodiment of the present technology.

FIG. 2 is a block diagram illustrating a configuration example of the monaural power amplifier 200 in the first embodiment of the present technology. The monaural power amplifier 200 includes a frequency divider 210, a delta-sigma modulator 220, a pulse width modulation circuit 250, an amplification section 260, and a low-pass filter 280.

The frequency divider 210 divides a master clock signal CLK0 by a given division ratio. The master clock signal CLK0 is a periodic signal having a given frequency and generated by a phase locked loop or other device (not depicted). The frequency divider 210 supplies the signal, obtained by the frequency division, to the delta-sigma modulator 220 as a clock signal CLK1.

The delta-sigma modulator 220 performs delta-sigma modulation of the audio data $P_{in}$ in synchronism with the clock signal CLK1. This delta-sigma modulation permits noise shaping that moves low-frequency noise to a high-frequency band. Noise that has moved to a high-frequency band is removed by the low-pass filter 280 provided at the subsequent stage, thereby contributing to reduced noise as compared to the case where no delta-sigma modulation is performed. We let the sampling frequency of the audio data $P_{in}$ be denoted by fs and the frequency of the clock signal CLK1 be denoted by a carrier frequency fc. Assuming, for example, that the carrier frequency fc is 16 times the sampling frequency fs and that the sampling frequency is 48 kilohertz (kHz), the carrier frequency fc is 768 (=16×48) kilohertz (kHz). The delta-sigma modulator 220 supplies modulated output data Za(t) to the pulse width modulation circuit 250. Here, t represents reproduction time.

The pulse width modulation circuit 250 modulates the pulse width of each of the pair of pulse signals in accordance with the output data Za(t) from the delta-sigma modulator 220. Here, pulse width modulation is conducted in synchronism with the master clock signal CLK0. Assuming, for example, that a frequency $f_{CLK}$ of the master clock signal CLK0 is 32 times the carrier frequency fc, the frequency $f_{CLK}$ is 24.576 (=0.768×32) megahertz (MHz). In this case, temporal resolution of the pulse width modulation has 32 levels. Hereinafter, one of the pair of pulse signals will be referred to as a "positive-side pulse signal," and the other will be referred to as a "negative-side pulse signal." The pulse width modulation circuit 250 supplies a positive-side pulse signal PA and a negative-side pulse signal PB, obtained by the modulation, to the amplification section 260.

The amplification section 260 amplifies amplitudes of the positive-side pulse signal PA and the negative-side pulse signal PB. Hereinafter, the positive-side pulse signal voltage after the amplification will be referred to as a "positive-side voltage," and the negative-side pulse signal voltage after the amplification will be referred to as a "negative-side voltage." The amplification section 260 supplies a positive-side voltage VA and a negative-side voltage VB to the low-pass filter 280.

The low-pass filter 280 passes low-frequency band signals of a signal that includes the positive-side voltage VA and the negative-side voltage VB. The positive-side voltage VA and the negative-side voltage VB that have passed through this low-pass filter 280 are supplied to the monaural speaker 120.

It should be noted that the circuit of the monaural power amplifier 200 that includes the frequency divider 210, the delta-sigma modulator 220, the pulse width modulation circuit 250, the amplification section 260, and the low-pass filter 280 is an example of a control circuit recited in the claims.

[Configuration Example of Delta-Sigma Modulator]

Figure 3:
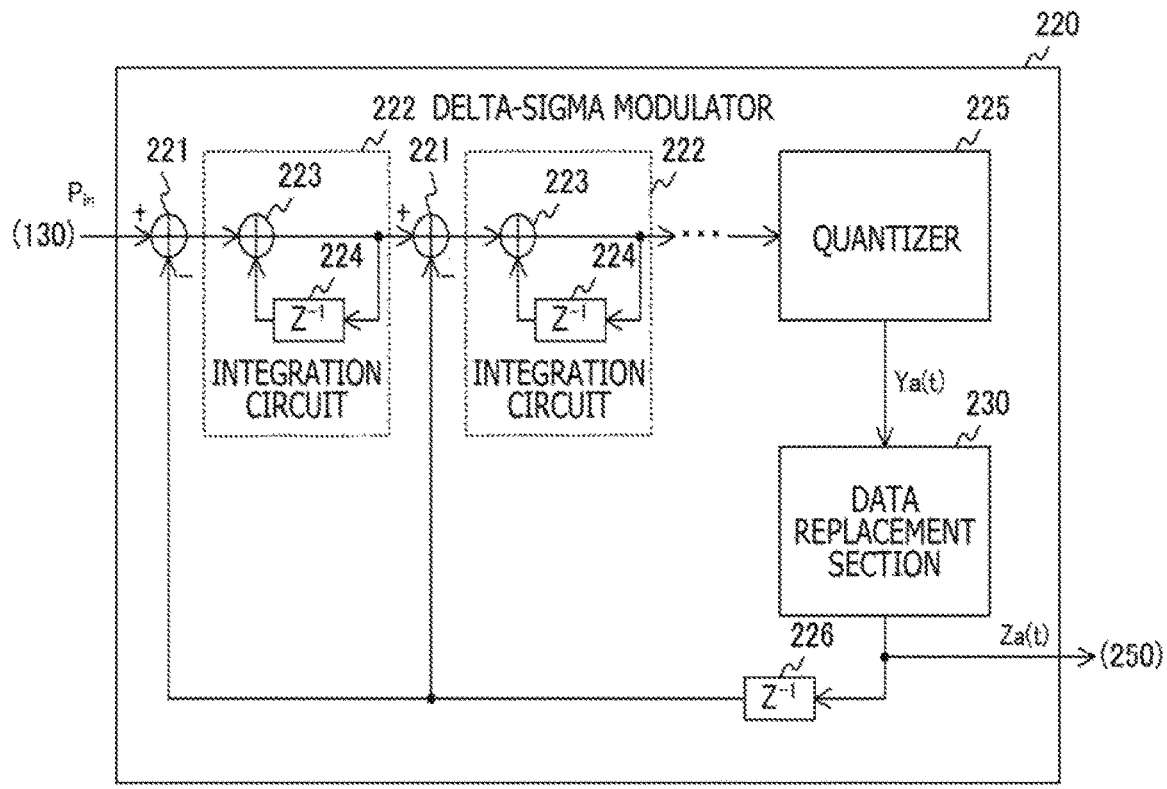
FIG. 3 is a block diagram illustrating a configuration example of a delta-sigma modulator in the first embodiment of the present technology.

FIG. 3 is a block diagram illustrating a configuration example of the delta-sigma modulator 220 in the first embodiment of the present technology. The delta-sigma modulator 220 includes a circuit having a plurality of stages, each including an adder 221 and an integration circuit 222, a quantizer 225, a data replacement section 230, and a delay section 226. Each of the integration circuits 222 includes an adder 223 and a delay section 224.

The adder 221 at the first stage calculates the difference between feedback data from the delay section 226 and the audio data $P_{in}$. The adder 221 supplies the calculated difference data to the integration circuit 222. Also, each of the adders 221 at the second and following stages calculates the difference between the data from the previous stage and the feedback data. It should be noted that the adders 221 are examples of a difference operator recited in the claims.

The integration circuit 222 calculates integral data by integrating difference data. The adder 223 in this integration circuit 222 adds the difference data from the adder 221 and the feedback data from the delay section 224 together and supplies the result to the adder 221 or the quantizer 225 at the subsequent stage as integral data. The delay section 224 delays the integral data and supplies the delayed data to the adder 223 as feedback data.

The quantizer 225 re-quantizes the integral data from the integration circuit 222 into data having a given number of bits. This quantizer 225 outputs the quantized data to the data replacement section 230 as control data Ya(t). This control data Ya(t) instructs that the modulation be performed on a pulse width of each of the positive-side pulse signal and the negative-side pulse signal at a reproduction time t. For example, the difference between the pulse widths of the positive-side pulse signal and the negative-side pulse signal is set in the control data Ya(t). It should be noted that the quantizer 225 is an example of a control data output section recited in the claims.

The data replacement section 230 replaces, in the case where the control data Ya(t) is output that instructs that the modulation leading to approximately the same pulse width for the positive-side pulse signal and the negative-side pulse signal be performed, the control data with different data for replacement. For example, in the case where the value of the control data Ya(t) (i.e., difference in pulse width) is "0," the positive-side pulse signal and the negative-side pulse signal are modulated in pulse width to approximately the same value. Therefore, in the case where the control data Ya(t) is "0," the data replacement section 230 replaces the control data Ya(t) with data for replacement other than "0" and outputs the data as output data Za(t).

On the other hand, in the case where the control data Ya(t) is not "0," the data replacement section 230 outputs the control data Ya(t) to the delay section 226 and the pulse width modulation circuit 250 in an as-is manner as the output data Za(t) without replacing the data.

The delay section 226 delays the output data Za(t) and feeds back the delayed output data Za(t) to the adder 221 at each stage as feedback data.

[Configuration Example of Data Replacement Section]

Figure 4:
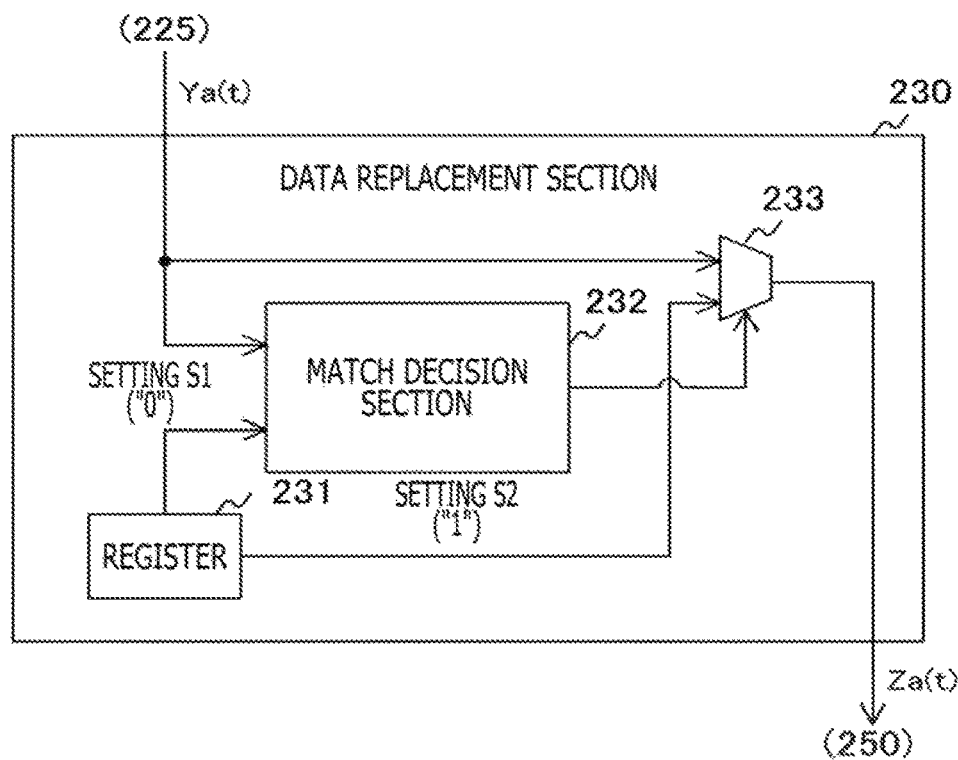
FIG. 4 is a block diagram illustrating a configuration example of a data replacement section in the first embodiment of the present technology.

FIG. 4 is a block diagram illustrating a configuration example of the data replacement section 230 in the first embodiment of the present technology. This data replacement section 230 includes a register 231, a match decision section 232, and a selector 233.

The register 231 holds settings S1 and S2. Here, the setting S1 is a value (e.g., "0") that leads to approximately the same pulse width for the positive-side and negative-side pulse signals. Also, the setting S2 is a value (e.g., "1") other than S1. It should be noted that although the setting S1 is "0," S1 is not limited to "0" as long as S1 leads to approximately the same pulse width.

The match decision section 232 decides whether or not the control data Ya(t) from the quantizer 225 matches the setting S1. This match decision section 232 supplies a decision result to the selector 233.

The selector 233 selects either the control data Ya(t) or the setting S2 on the basis of the decision result of the match decision section 232. This selector 233 selects the setting S2 in the case where the control data Ya(t) matches the setting S1 and selects Ya(t) in the case of a mismatch. Then, the selector 233 supplies the selected data to the pulse width modulation circuit 250 as the output data Za(t).

Figures 5, 6:
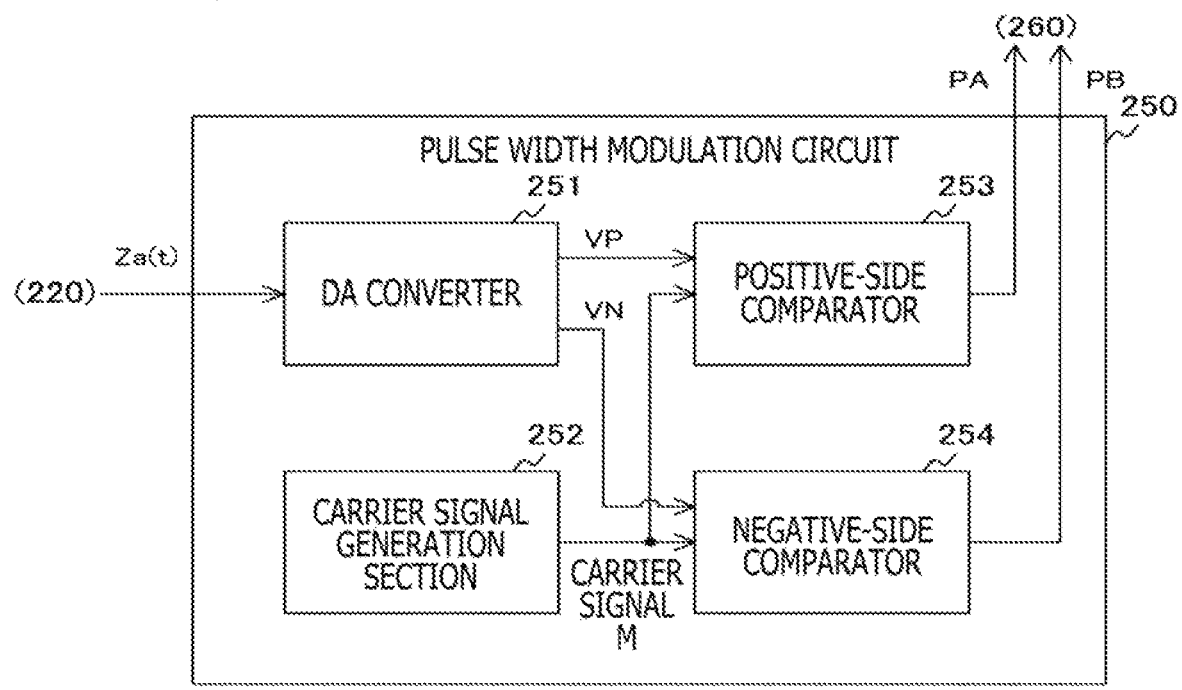
FIG. 5 is a diagram illustrating an example of action of the data replacement section in the first embodiment of the present technology.
FIG. 6 is a block diagram illustrating a configuration example of a pulse width modulation circuit in the first embodiment of the present technology.

FIG. 5 is a diagram illustrating an example of action of the data replacement section 230 in the first embodiment of the present technology. In the case where the input control data Ya(t) is the setting S1 (e.g., "0") that leads to approximately the same pulse width, the data replacement section 230 replaces the input control data Ya(t) with the different setting S2 (e.g., "1") and outputs the data as the output data Za(t).

On the other hand, in the case where the input control data Ya(t) is a value other than the setting S1, the data replacement section 230 outputs the control data Ya(t) in an as-is manner as the output data Za(t).

[Configuration Example of Pulse Width Modulation Circuit]

FIG. 6 is a block diagram illustrating a configuration example of the pulse width modulation circuit 250 in the first embodiment of the present technology. This pulse width modulation circuit 250 includes a DA converter 251, a carrier signal generation section 252, a positive-side comparator 253, and a negative-side comparator 254.

The DA converter 251 converts the output data Za(t) into an analog differential signal through DA conversion. Here, the differential signal includes a positive-side voltage VP and a negative-side voltage VN. The DA converter 251 supplies the positive-side voltage VP to the positive-side comparator 253 and the negative-side voltage VN to the negative-side comparator 254.

The carrier signal generation section 252 generates a periodic signal having a given waveform (e.g., rectangular wave, triangular wave) as a carrier signal M and supplies the signal to the positive-side comparator 253 and the negative-side comparator 254.

The positive-side comparator 253 compares the positive-side voltage VP with the voltage of the carrier signal M. This positive-side comparator 253 supplies a comparison result to the amplification section 260 as the positive-side pulse signal PA.

The negative-side comparator 254 compares the negative-side voltage VN with the voltage of the carrier signal M. This negative-side comparator 254 supplies a comparison result to the amplification section 260 as the negative-side pulse signal PB.

With the above configuration, each of the positive-side and negative-side pulse signals is modulated in pulse width. The difference between the pulse widths of these pulse signals is proportional to the output data Za(t).

[Configuration Example of Amplification Section]

Figure 7:
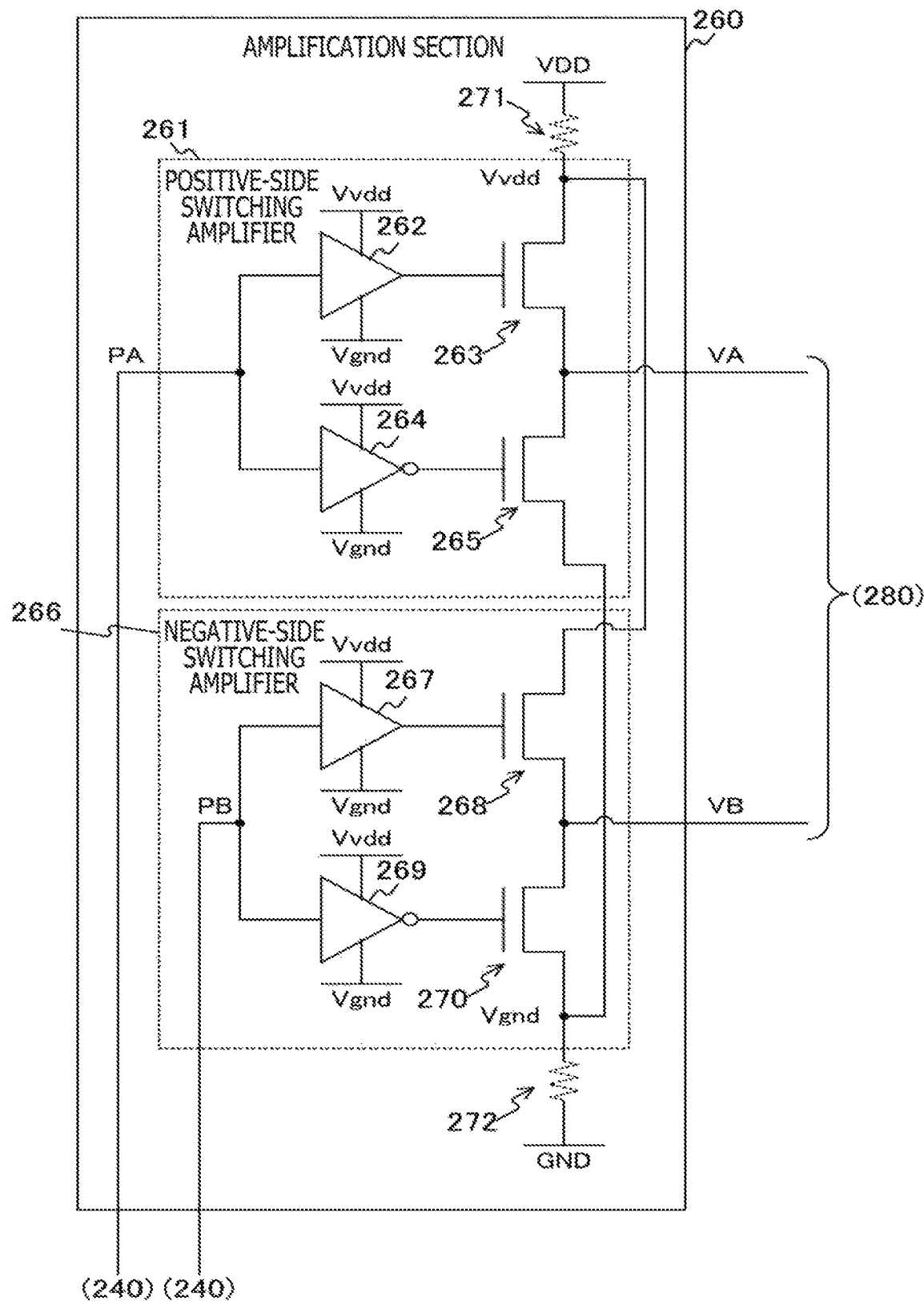
FIG. 7 is a circuit diagram illustrating a configuration example of an amplification section in the first embodiment of the present technology.

FIG. 7 is a circuit diagram illustrating a configuration example of the amplification section 260 in the first embodiment of the present technology. This amplification section 260 includes a positive-side switching amplifier 261 and a negative-side switching amplifier 266.

The positive-side switching amplifier 261 amplifies the positive-side pulse signal PA. This positive-side switching amplifier 261 includes drivers 262 and 264 and drive transistors 263 and 265.

The driver 262 amplifies the positive-side pulse signal PA and supplies the signal to the drive transistor 263. The driver 264 amplifies the positive-side pulse signal PA, inverts the signal, and supplies the inverted signal to the drive transistor 265.

Each of the drive transistors 263 and 265 is, for example, an N-type MOSFET (Metal Oxide Semiconductor Field Effect Transistor) and connected in series between a power terminal of the supply voltage VDD and a ground terminal of a ground voltage GND. Also, an output signal from the driver 262 is input to a gate of the drive transistor 263, and an output signal from the driver 264 is input to the gate of the drive transistor 265. Then, a connection point between the drive transistors 263 and 265 is connected to the low-pass filter 280. The voltage of this connection point corresponds to the positive-side voltage VA after the amplification.

With the above configuration, when the positive-side pulse signal PA rises, the positive-side drive transistor 263 makes a transition from an ON state to an OFF state, and the negative-side drive transistor 265 makes a transition to an OFF state. As a result, the positive-side voltage VA reaches, for example, Vvdd. This Vvdd is a voltage is lower than the supply voltage VDD by a parasitic impedance 271 on the power line. Also, when the positive-side pulse signal PA falls, the negative-side drive transistor 265 makes a transition from an OFF state to an ON state, and the positive-side drive transistor 263 makes a transition to an OFF state. As a result, the positive-side voltage VA reaches, for example, Vgnd. This Vgnd is higher than the ground voltage by a parasitic impedance 272 on the ground line and lower than Vvdd.

Thus, the positive-side switching amplifier 261 generates the positive-side voltage VA by switching the drive transistors 263 and 265. For this reason, large currents flow momentarily at rising and falling edges of the positive-side voltage VA due to charging and discharging of gate capacitances of drive transistors 263 and 265 and a parasitic capacitance between interconnects that transmit the positive-side voltage VA and the negative-side voltage VB. The flow of this momentary current through the parasitic impedances 271 and 272 causes Vvdd and Vgnd to vary.

The negative-side switching amplifier 266 amplifies the negative-side pulse signal PB. This negative-side switching amplifier 266 includes drivers 267 and 269 and drive transistors 268 and 270.

The driver 267 outputs the negative-side pulse signal PB amplifies the negative-side pulse signal PB and supplies the signal to the drive transistor 268. The driver 269 amplifies the negative-side pulse signal PB, inverts the signal, and supplies the inverted signal to the drive transistor 270.

Each of the drive transistors 268 and 270 is, for example, an N-type MOSFET and connected in series between the power terminal of the supply voltage VDD and the ground terminal of the ground voltage GND. Also, an output signal from the driver 267 is input to the gate of the drive transistor 268, and an output signal from the driver 269 is input to the gate of the drive transistor 270. Then, the connection point between the drive transistors 268 and 270 is connected to the low-pass filter 280. The voltage of this connection point corresponds to the negative-side voltage VB after the amplification.

With the above configuration, when the negative-side pulse signal PB rises, the positive-side drive transistor 268 makes a transition from an ON state to an OFF state, and the negative-side drive transistor 270 makes a transition to an OFF state. As a result, the negative-side voltage VB reaches, for example, Vvdd. Also, when the negative-side pulse signal PB falls, the negative-side drive transistor 270 makes a transition from an OFF state to an ON state, and the positive-side drive transistor 268 makes a transition to an OFF state. As a result, the negative-side voltage VB reaches, for example, Vgnd.

The negative-side switching amplifier 266 has a similar configuration to the positive-side switching amplifier 261. Therefore, large currents flow momentarily at rising and falling edges of the negative-side voltage VB as on the positive side, causing Vvdd and Vgnd to fluctuate.

Then, in the case where edge timings of the positive-side voltage VA and edge timings of the negative-side voltage VB are close to each other, Vvdd and Vgnd fluctuate to a larger extent than in the case where the timings are not close. This voltage fluctuation leads to an error in transition timings of each of the positive-side voltage VA and an edge timing of the negative-side voltage VB. The error remains in the audio signal as noise, causing a decline in SNR (Signal to Noise Ratio). In particular, during a signal-less period (e.g., period when control data is "0"), the positive-side and negative-side edge timings are more often approximately the same, resulting in more noise than during a signal-less period.

[Configuration Example of Low-Pass Filter]

Figure 8:
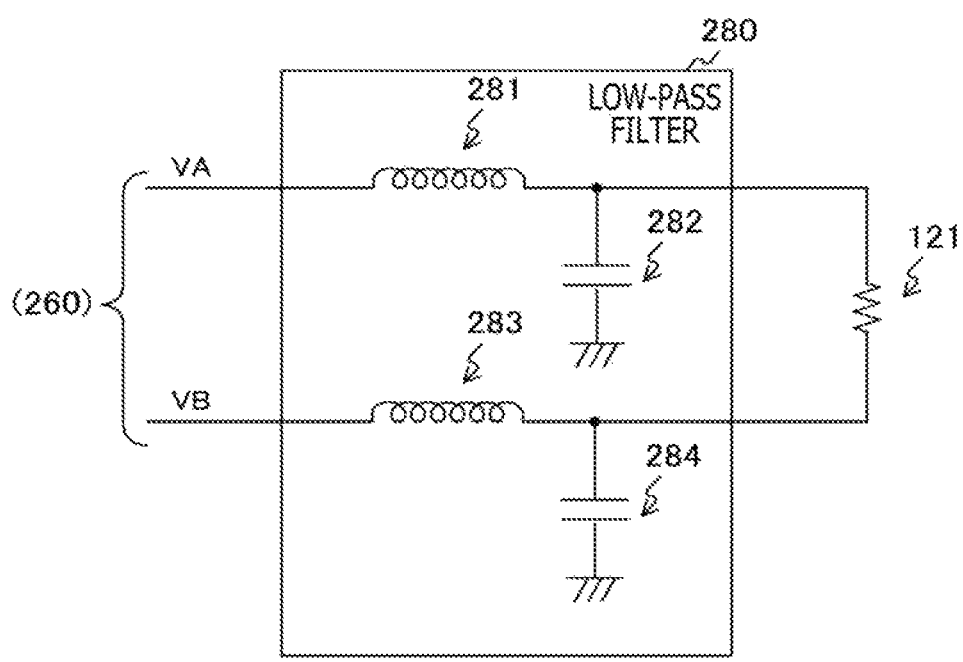
FIG. 8 is a circuit diagram illustrating a configuration example of a low-pass filter in the first embodiment of the present technology.

FIG. 8 is a circuit diagram illustrating a configuration example of the low-pass filter 280 in the first embodiment of the present technology. This low-pass filter 280 includes inductors 281 and 283 and capacitors 282 and 284.

The inductor 281 has its one end connected to a positive-side signal line to which the positive-side voltage VA is applied and its other end connected to one end of an impedance 121 and the capacitor 282. This impedance 121 represents the impedance of the monaural speaker 120 as viewed from the side of the low-pass filter 280. The inductor 283 has its one end connected to a negative-side signal line to which the negative-side voltage VB is applied and its other end connected to other end of the impedance 121 and the capacitor 284. Such an LC filter cuts down signals in high-frequency bands of the positive-side voltage VA and the negative-side voltage VB.

Figure 9:
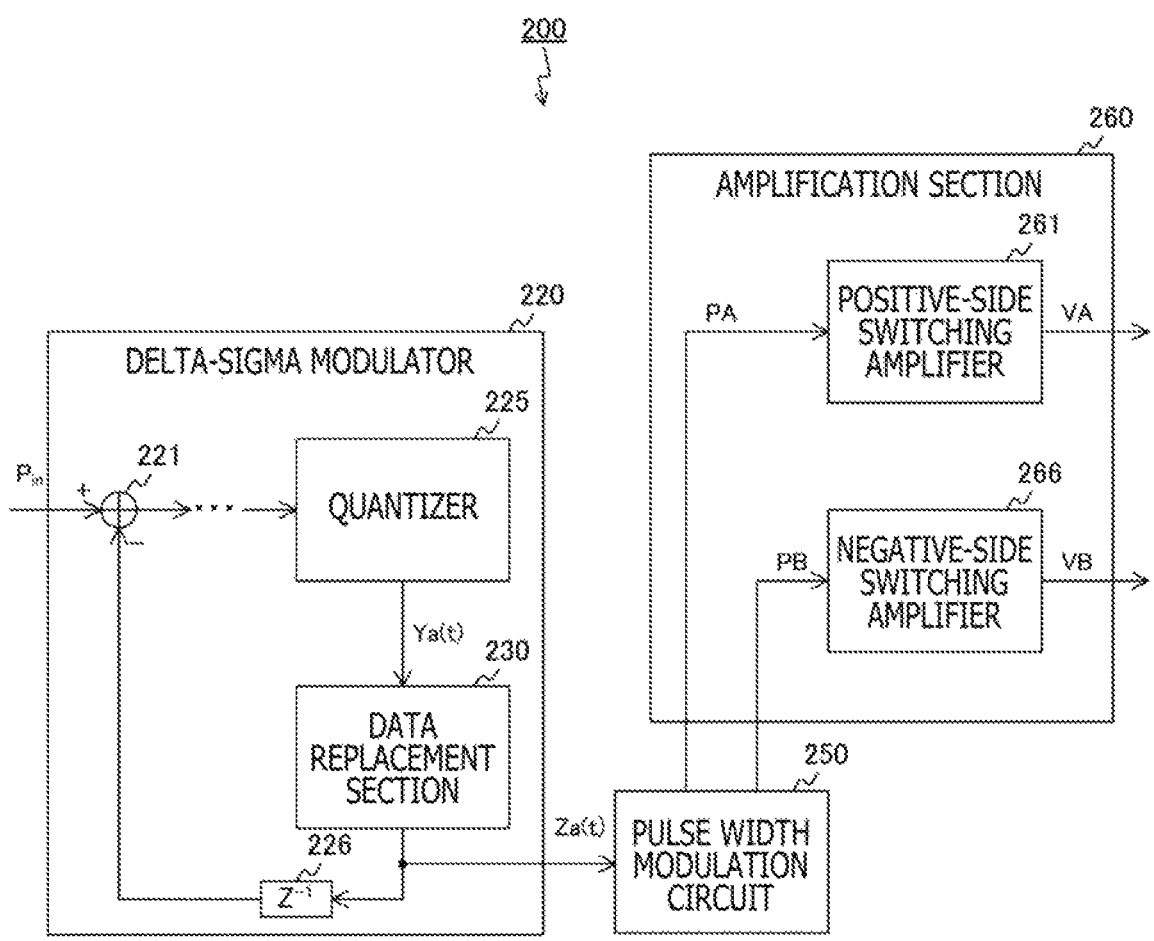
FIG. 9 is a block diagram illustrating a functional configuration example of the monaural power amplifier in the first embodiment of the present technology.

FIG. 9 is a block diagram illustrating a functional configuration example of the monaural power amplifier 200 in the first embodiment of the present technology. The quantizer 225 in the delta-sigma modulator 220 generates the control data Ya(t). The data replacement section 230 replaces the control data Ya(t) with data other than "0" in the case where the control data Ya(t) is "0." The pulse width modulation circuit 250 modulates the pulse width of the positive-side pulse signal PA and the negative-side pulse signal PB in accordance with the output data Za(t) from the data replacement section 230. The positive-side switching amplifier 261 and the negative-side switching amplifier 266 amplify the positive-side pulse signal PA and the negative-side pulse signal PB that have been modulated.

An amplifier having the pulse width modulation circuit 250 that modulates the pulse widths of pulse signals and the switching amplifiers (261 and 266) that amplify the pulse signals as described above is commonly referred to as a class-D amplifier.

It should be noted that although the delta-sigma modulator 220, the pulse width modulation circuit 250, and the amplification section 260 are provided in the monaural power amplifier 200 that amplifies audio signals, a circuit other than the monaural power amplifier 200 may be provided as long as this circuit modulates pulse widths of pulse signals and amplifies the pulse signals.

Figure 10:
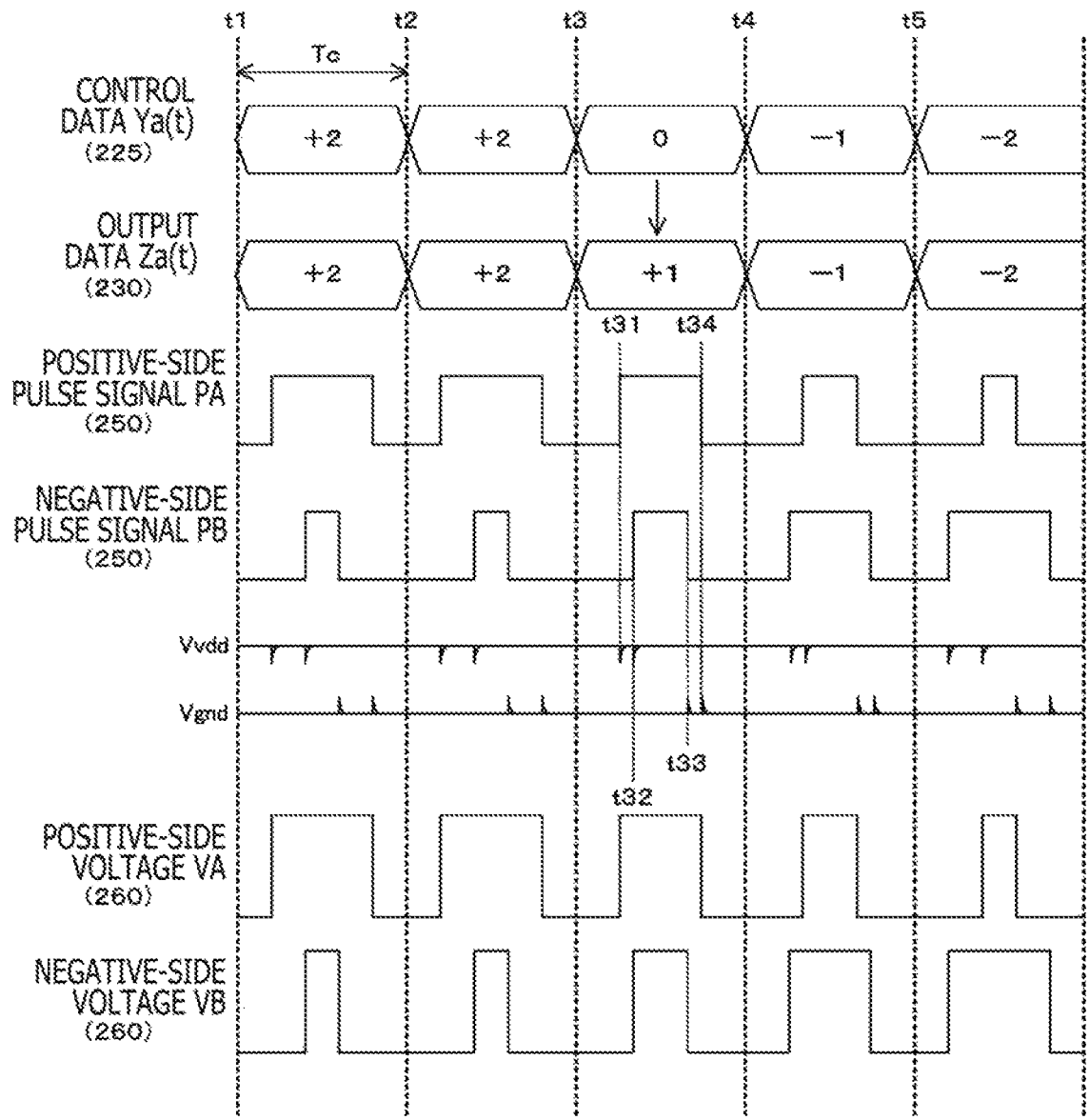
FIG. 10 is a timing chart illustrating examples of control data, output data, pulse signals, and voltage fluctuations in the first embodiment of the present technology.

FIG. 10 is a timing chart illustrating examples of control data, output data, pulse signals, and voltage fluctuations in the first embodiment of the present technology. The quantizer 225 generates control data of a given data size each time a period Tc of the clock signal CLK1 elapses. In the case where a carrier frequency fc of the clock signal CLK1 is 768 kilohertz (kHz), the period Tc is approximately 1.3 microseconds ($\mu$s). Also, control data represents a sign and an absolute value of the difference between the pulse widths of the positive-side pulse signal PA and the negative-side pulse signal PB to be generated. For example, control data with a value of "+2" is generated at time t1, and control data with a value of "+2" is generated at time t2, and control data with a value of "0" is generated at time t3. Also, control data with a value of "−1" is generated at time t4, and control data with a value of "−2" is generated at time t5.

Because the control data matches "0" at time t3, the data replacement section 230 replaces the value thereof with "+1" and outputs the control data as the output data Za(t). Also, because the control data is not "0" at times t1, t2, t4, and t5, the data replacement section 230 outputs the control data in an as-is manner as the output data Za(t) without replacing the data.

The pulse width modulation circuit 250 modulates the pulse width of each of the positive-side voltage VA and the negative-side voltage VB in accordance with the output data Za(t). Because the sign of the output data Za(t) is positive ("+") at times t1, t2, and t3, the pulse width modulation circuit 250 lengthens the pulse width of the positive-side pulse signal PA longer than that of the negative-side pulse signal PB. The larger the absolute value of the output data Za(t), the larger the difference in pulse width. Also, at times t4 and t5, the sign of the output data Za(t) is negative ("−"), the pulse width modulation circuit 250 lengthens the pulse width of the negative-side pulse signal PB longer than that of the positive-side pulse signal PA.

Also, in the pulse width modulation circuit 250, the voltages Vvdd and Vgnd fluctuate due to a momentary current at the rising and falling edges of the pulse signals. The positive-side switching amplifier 261 and the negative-side switching amplifier 266 amplify the amplitudes of the positive-side pulse signal PA and the negative-side pulse signal PB and output the positive-side voltage VA and the negative-side voltage VB, respectively.

In the period during which one of the positive-side voltage VA and the negative-side voltage VB is high (e.g., Vvdd) and the other is low (e.g., Vgnd), a voltage is applied to the monaural speaker 120 via the low-pass filter 280. The signal flowing through the monaural speaker 120 is an analog signal proportional to the level represented by the audio data $P_{in}$. Also, in the period during which the positive-side voltage VA and the negative-side voltage VB are both high, and in the period during which these voltages are both low, no voltage is applied to the monaural speaker 120.

We assume here a comparative example in which the control data Ya(t) with a value of "0" is not replaced. In this comparative example, the pulse widths of the positive-side pulse signal PA and the negative-side pulse signal PB are modulated to approximately the same value because of the output data Za(t) with a value of "0." In this case, the edge timings of these pulse signals are approximately the same. This may cause the positive-side switching amplifier 261 and the negative-side switching amplifier 266 to be switched simultaneously, leading to a voltage fluctuation and lowering the SNR.

In contrast, in the monaural power amplifier 200, in the case where control data has a specific value that leads to approximately the same pulse width (i.e., simultaneous switching), the data replacement section 230 replaces the control data with other data, thereby avoiding simultaneous switching. For example, "0" is replaced with "+1" at time t3. As a result, the positive-side pulse signal PA rises at time t31, and thereafter, the negative-side pulse signal PB rises at time t32. Then, at time t33, the negative-side pulse signal PB falls, and thereafter, the positive-side pulse signal PA falls at time t34. The switching amplifiers are switched at different timings as described above, thus permitting reduction in noise caused by simultaneous switching and providing improved SNR.

A quantization error is applied to the audio signal as a result of the replacement of the control data. This quantization error is added to a feedback loop of the delta-sigma modulator 220 and fed back. Therefore, the linearity of the output data Za(t) relative to the input data ($P_{in}$) of the delta-sigma modulator 220 is ensured.

It should be noted that one possible way of avoiding simultaneous switching other than the above data replacement is to shift the phase of one of the pair of pulse signals. For example, it is sufficient if the pulse signal is delayed by providing an analog circuit such as CR circuit at the subsequent stage of the positive-side comparator 253 and the negative-side comparator 254. It should be noted, however, that this configuration may lead to a larger circuit scale and increased costs due to the addition of an analog circuit.

Also, possible ways of suppressing voltage fluctuation caused by simultaneous switching are to provide a decoupling capacitor and separate power supply lines. In the former approach, for example, a large-capacity decoupling capacitor is connected to the power supply line that supplies the supply voltage VDD. Also, in the latter approach, for example, the power supply line of the positive-side switching amplifier 261 and that of the negative-side switching amplifier 266 are connected to different regulators. This may lead to a larger circuit scale and increased costs due to the addition of a large-capacity decoupling capacitor or regulators.

In contrast, the monaural power amplifier 200 only replaces data. This eliminates the need to add a CR circuit or regulators. Also, a decoupling capacitor can be rendered unnecessary, or the capacity thereof can be reduced. For this reason, it is possible to improve the SNR while at the same time suppressing an increase in circuit scale and costs.

Figure 11A:
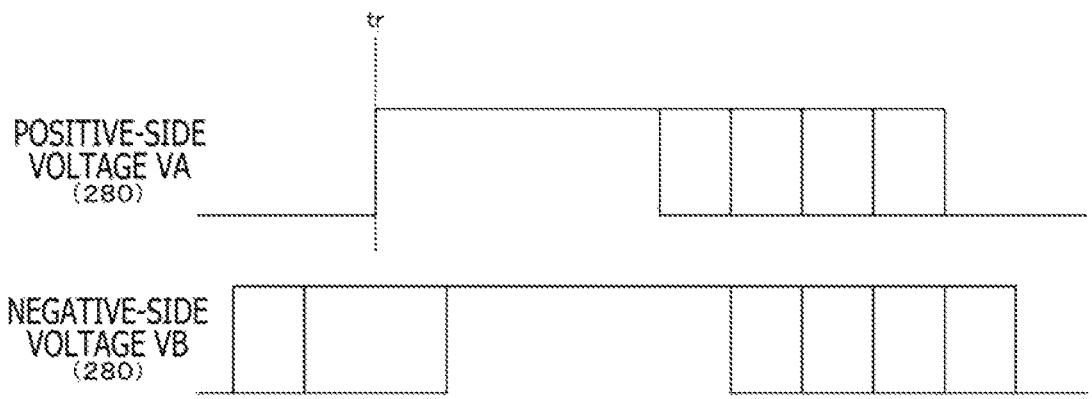
FIGS. 11A and 11B represent diagrams illustrating examples of phases of positive-side and negative-side voltages in the first embodiment of the present technology and a comparative example.
Figure 11B:
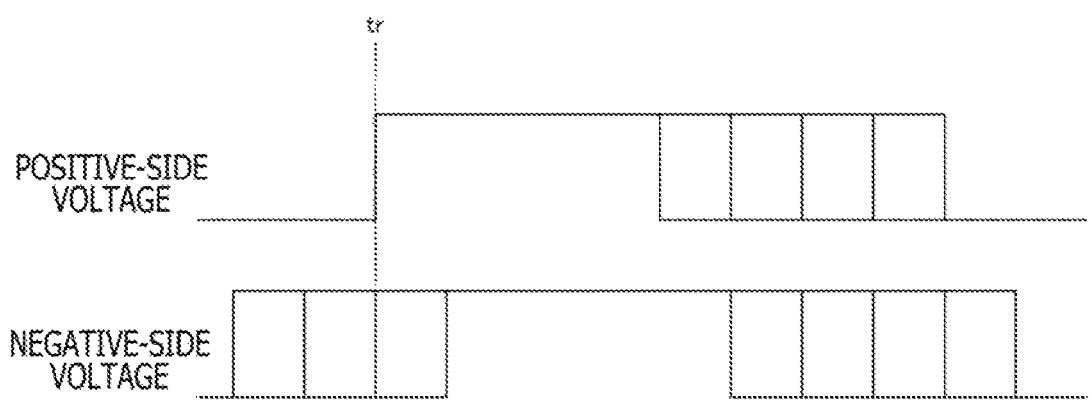

FIGS. 11A and 11B represent diagrams illustrating examples of phases of the positive-side voltage VA and the negative-side voltage VB in the first embodiment of the present technology and a comparative example. a in the figure illustrates observation results, using, for example, an oscilloscope, of changes in the edge timing of the negative-side voltage VB relative to the rising edge timing of the positive-side voltage VA, a reference timing tr, in the first embodiment. Because of the replacement of control data, the positive-side pulse signal PA and the negative-side pulse signal PB have different edge timings. This makes it less likely for a rising edge of the negative-side voltage VB to occur at a rising edge (tr) of the positive-side voltage VA, thereby ensuring improved SNR. It should be noted that a similar effect is also observed when a falling edge of the positive-side voltage VA is used as a reference timing.

a in the figure illustrates observation results, using, for example, an oscilloscope, of changes in the edge timing of the negative-side voltage relative to the rising edge timing of the positive-side voltage, the reference timing tr, in a comparative example where control data is not replaced. In the case where control data is not replaced, the edge timings of the positive-side pulse signal PA and the negative-side pulse signal PB are approximately the same, for example, during a signal-less period. For this reason, a rising edge of the negative-side voltage is highly likely to occur at the rising edge (tr) of the positive-side voltage, thus deteriorating the SNR.

[Example of Action of Acoustic Equipment]

Figure 12:
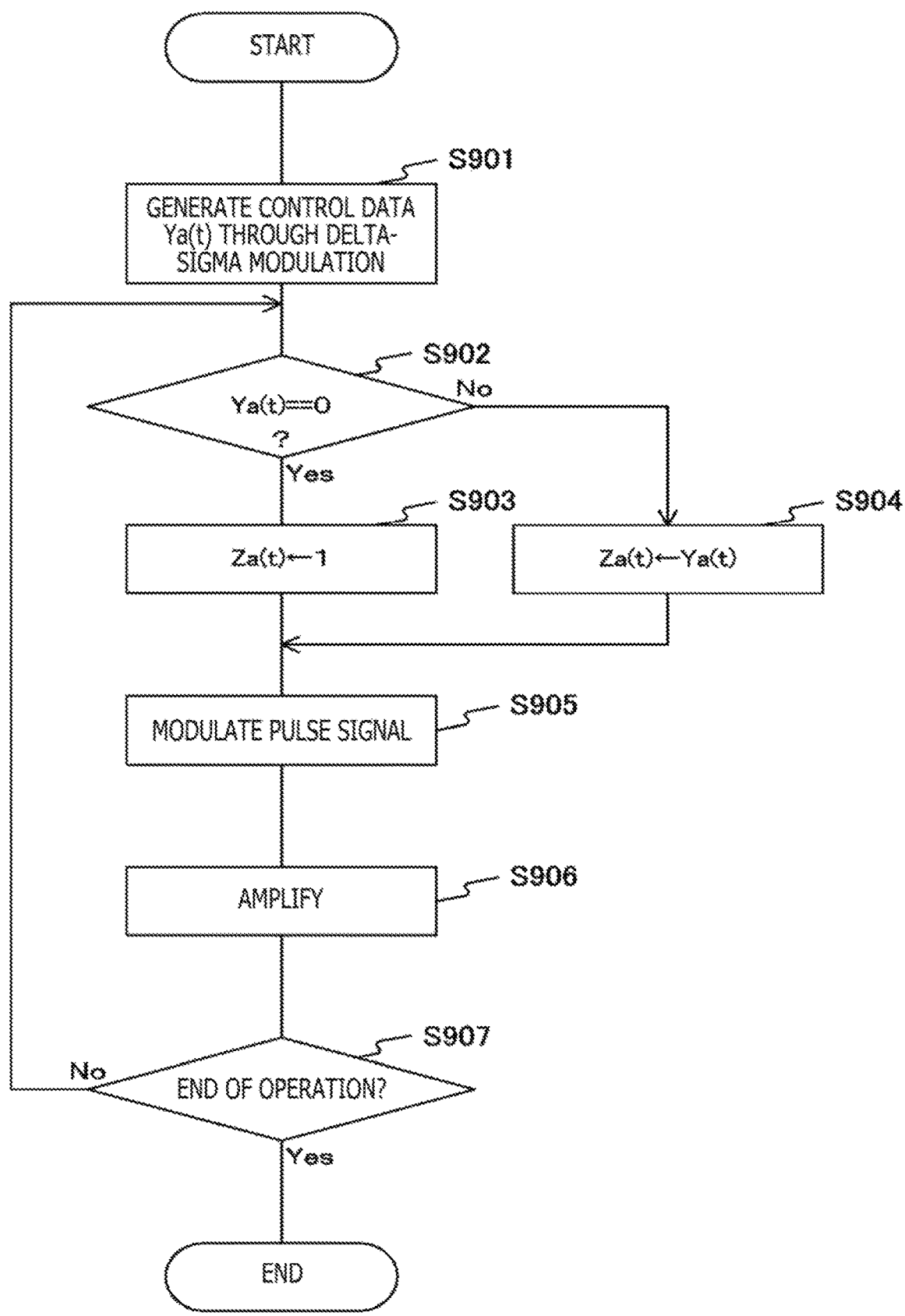
FIG. 12 is a flowchart illustrating an example of action of the acoustic equipment in the first embodiment of the present technology.

FIG. 12 is a flowchart illustrating an example of action of the acoustic equipment 100 in the first embodiment of the present technology. This action is initiated when operation for reproducing the audio data $P_{in}$ (e.g., pressing a play button) is performed.

The delta-sigma modulator 220 generates the control data Ya(t) through delta-sigma modulation (step S901). The data replacement section 230 decides whether or not the control data Ya(t) is "0" (step S902). In the case where the control data Ya(t) is "0" (Yes in step S902), the data replacement section 230 sets the output data Za(t) to "1" (step S903). On the other hand, in the case where the control data Ya(t) is not "0" (No in step S902), the data replacement section 230 sets the output data Za(t) to the control data Ya(t) (step S904).

After step S903 or S904, the pulse width modulation circuit 250 modulates the pulse width of each of the positive-side and negative-side pulse signals in accordance with the output data Za(t) (step S905). Then, the positive-side switching amplifier 261 and the negative-side switching amplifier 266 amplify the positive-side and the negative-side pulse signals, respectively, and output the pulse signals to the monaural speaker 120 via the low-pass filter 280 (step S906).

The acoustic equipment 100 decides whether or not operation for terminating the audio reproduction (e.g., pressing a stop button) has been performed (step S907). In the case where the operation for terminating the audio reproduction has yet to be performed (No in step S907), the acoustic equipment 100 repeats step S902 and subsequent steps. On the other hand, in the case where the operation for terminating the audio reproduction has been performed (Yes in step S907), the acoustic equipment 100 terminates its audio reproduction action.

In the first embodiment of the present technology, the data replacement section 230 replaces control data that leads to approximately the same pulse width for the pair of pulse signals. This allows the pulse signals to have different edge timings. As a result, it is possible to avoid simultaneous switching of the positive-side switching amplifier 261 and the negative-side switching amplifier 266, thus permitting reduction in noise caused by simultaneous switching and providing improved SNR.

2. Second Embodiment

In the first embodiment, the acoustic equipment 100 replaced control data of only one channel. However, the acoustic equipment 100 that reproduces stereo audio generates L (left) channel control data and R (right) channel control data. For this reason, replacement for one channel alone may not permit noise reduction for the remaining channel. The acoustic equipment 100 of this second embodiment differs from the first embodiment in that it replaces both L-channel control data and R-channel control data.

Figure 13:
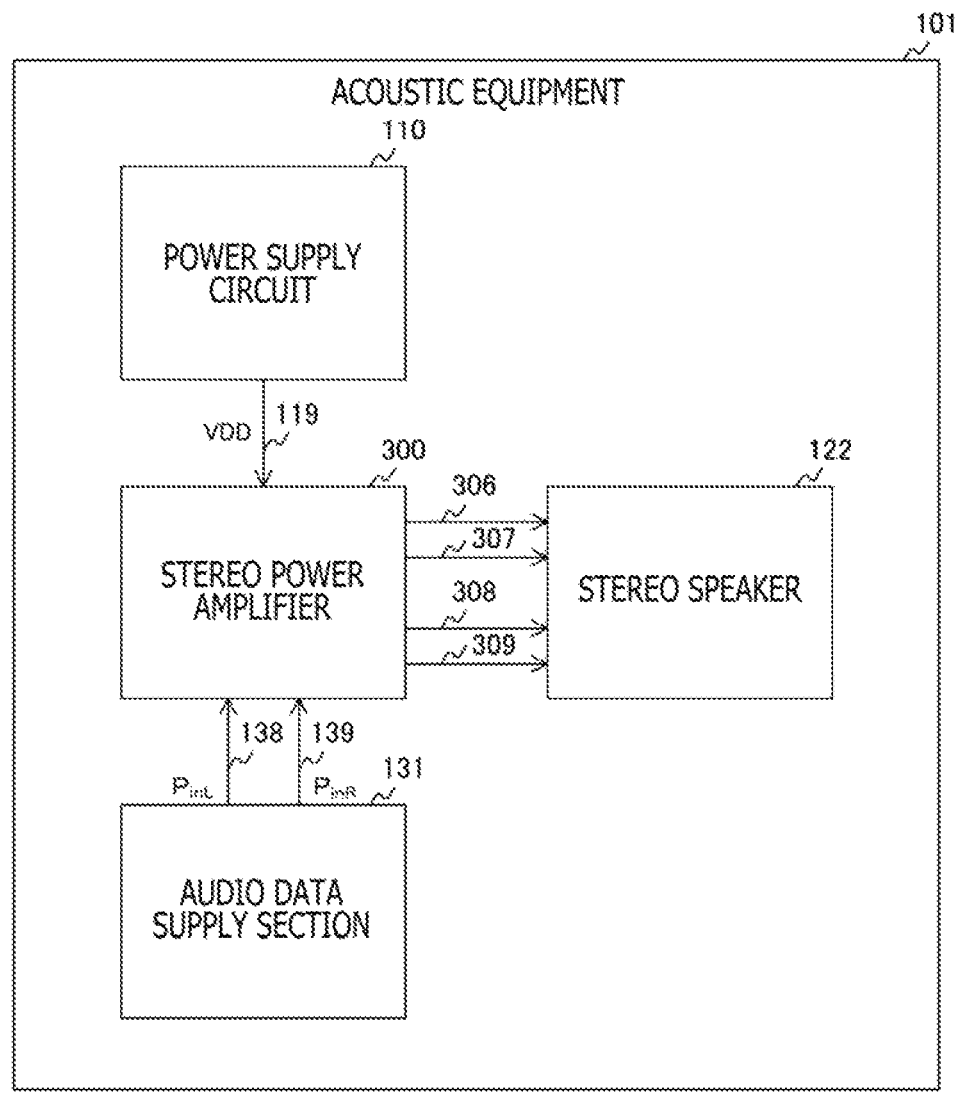
FIG. 13 is a block diagram illustrating a configuration example of acoustic equipment in a second embodiment of the present technology.

FIG. 13 is a block diagram illustrating a configuration example of acoustic equipment 101 in the second embodiment of the present technology. This acoustic equipment 101 differs from the first embodiment in that it includes an audio data supply section 131, a stereo power amplifier 300, and a stereo speaker 122 in place of the audio data supply section 130, the monaural power amplifier 200, and the monaural speaker 120.

The audio data supply section 131 supplies L-channel audio data $P_{inL}$ and R channel audio data $P_{inR}$ to the stereo power amplifier 300 via signal lines 138 and 139.

The stereo power amplifier 300 converts the audio data $P_{inL}$ into L-side differential pulse signals and supplies the signals to the stereo speaker 122 via signal lines 306 and 307. The stereo power amplifier 300 converts the audio data $P_{inR}$ into R-side differential pulse signals and supplies the signals to the stereo speaker 122 via signal lines 308 and 309.

The stereo speaker 122 outputs L-side audio whose level is proportional to the difference in pulse width between the L-side differential pulse signals and R-side audio whose level is proportional to the difference in pulse width between the R-side differential pulse signals.

Figure 14:
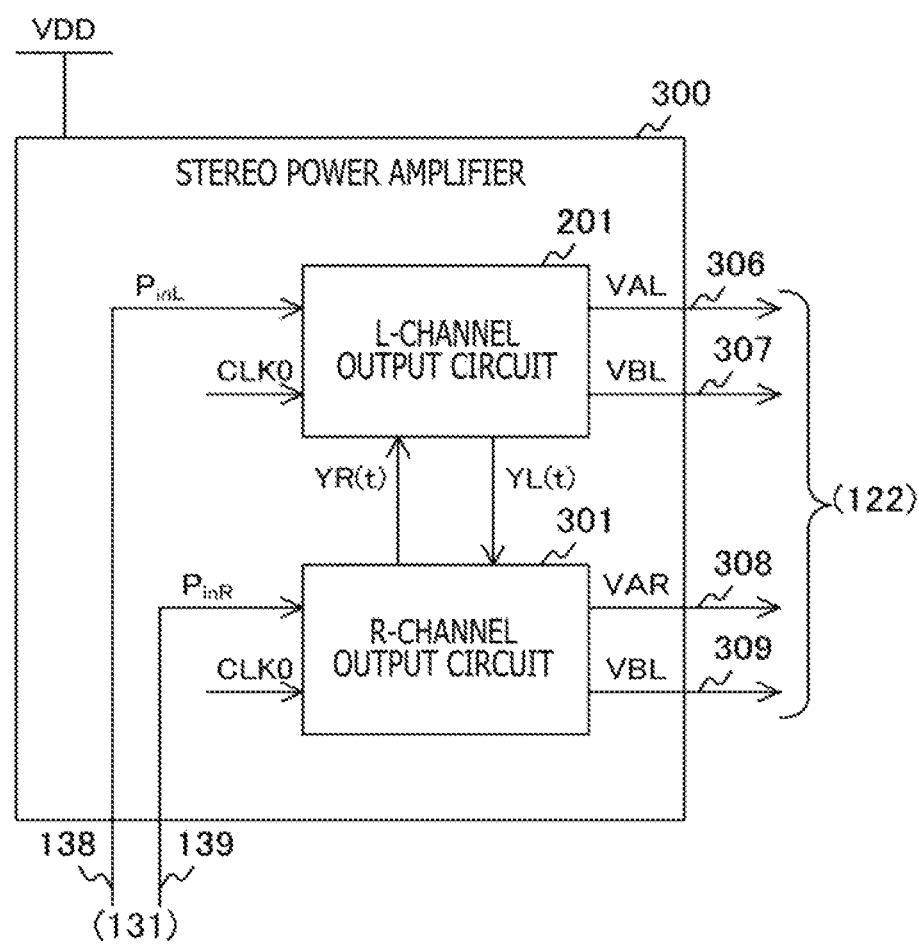
FIG. 14 is a block diagram illustrating a configuration example of a stereo power amplifier in the second embodiment of the present technology.

FIG. 14 is a block diagram illustrating a configuration example of the stereo power amplifier 300 in the second embodiment of the present technology. This stereo power amplifier 300 includes an L-channel output circuit 201 and an R-channel output circuit 301.

The L-channel output circuit 201 converts the audio data $P_{inL}$ into an L-channel positive-side voltage VAL and an L-channel negative-side voltage VBL and supplies the voltages to the stereo speaker 122. The R-channel output circuit 301 converts the audio data $P_{inR}$ into an R-channel positive-side voltage VAR and an R-channel negative-side voltage VBR and supplies the voltages to the stereo speaker 122.

Figure 15:
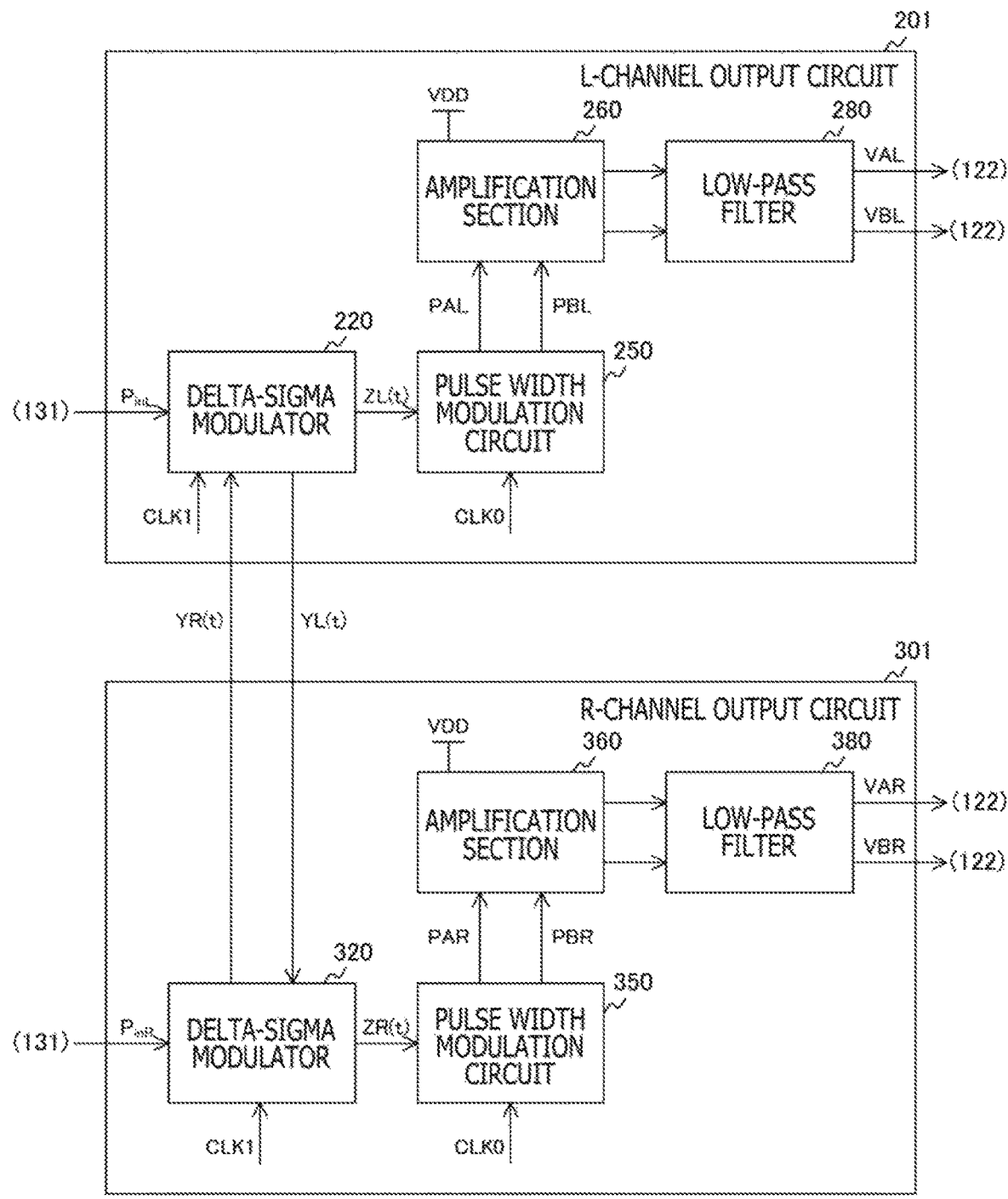
FIG. 15 is a block diagram illustrating configuration examples of an L-channel output circuit and an R-channel output circuit in the second embodiment of the present technology.

FIG. 15 is a block diagram illustrating a configuration example of the L-channel output circuit 201 and the R-channel output circuit 301 in the second embodiment of the present technology. The L-channel output circuit 201 includes the delta-sigma modulator 220, the pulse width modulation circuit 250, the amplification section 260, and the low-pass filter 280. The R-channel output circuit 301 includes a delta-sigma modulator 320, a pulse width modulation circuit 350, an amplification section 360, and a low-pass filter 380. It should be noted that a frequency divider that divides the master clock signal CLK0 is omitted in the figure.

The configuration having the delta-sigma modulator 220, the pulse width modulation circuit 250, the amplification section 260, and the low-pass filter 280 is similar to that in the first embodiment. Also, the configuration having the delta-sigma modulator 320, the pulse width modulation circuit 350, the amplification section 360, and the low-pass filter 380 is similar to that in the first embodiment. It should be noted, however, that the delta-sigma modulator 220 outputs L-channel control data YL(t) to the delta-sigma modulator 320 and that the delta-sigma modulator 320 outputs R-channel control data YR(t) to the delta-sigma modulator 220.

Figure 16:
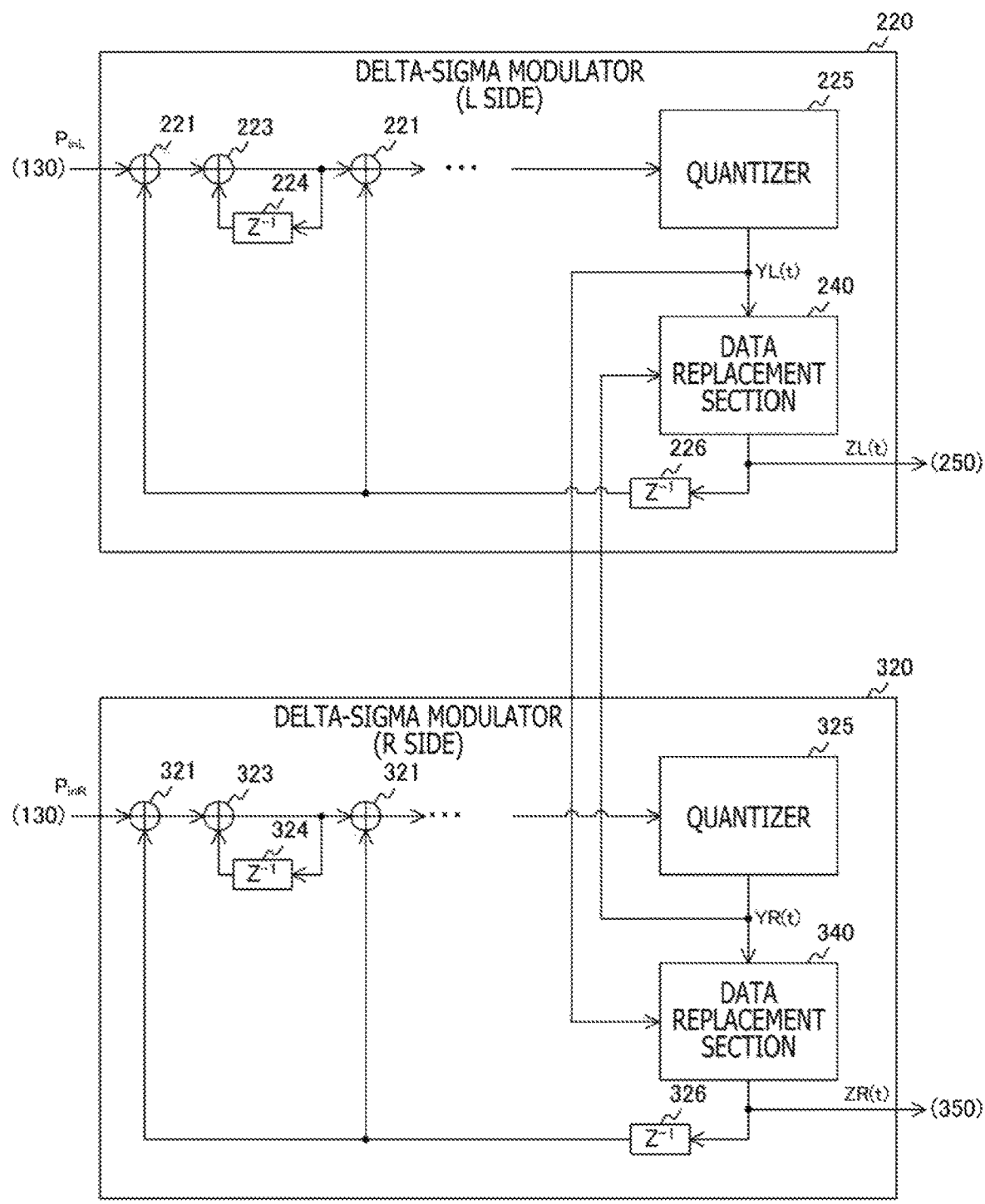
FIG. 16 is a block diagram illustrating a configuration example of the delta-sigma modulator in the second embodiment of the present technology.

FIG. 16 is a block diagram illustrating configuration examples of the delta-sigma modulator 220 and the delta-sigma modulator 320 in the second embodiment of the present technology. The delta-sigma modulator 220 in the second embodiment differs from the first embodiment in that it includes a data replacement section 240 in place of the data replacement section 230.

Also, the delta-sigma modulator 320 includes a plurality of adders 321, a plurality of integration circuits, each including an adder 323 and a delay section 324, a quantizer 325, a data replacement section 340, and a delay section 326. The components of the delta-sigma modulator 320 other than the data replacement section 340 are similar to those in the first embodiment.

The data replacement section 240 replaces, in the case where the control data YL(t) is "0" or −YR(t), the control data YL(t) with different data for replacement. Also, the data replacement section 340 replaces, in the case where the control data YR(t) is "0" or +YL(t), the control data YR(t) with different data for replacement.

Figure 17:
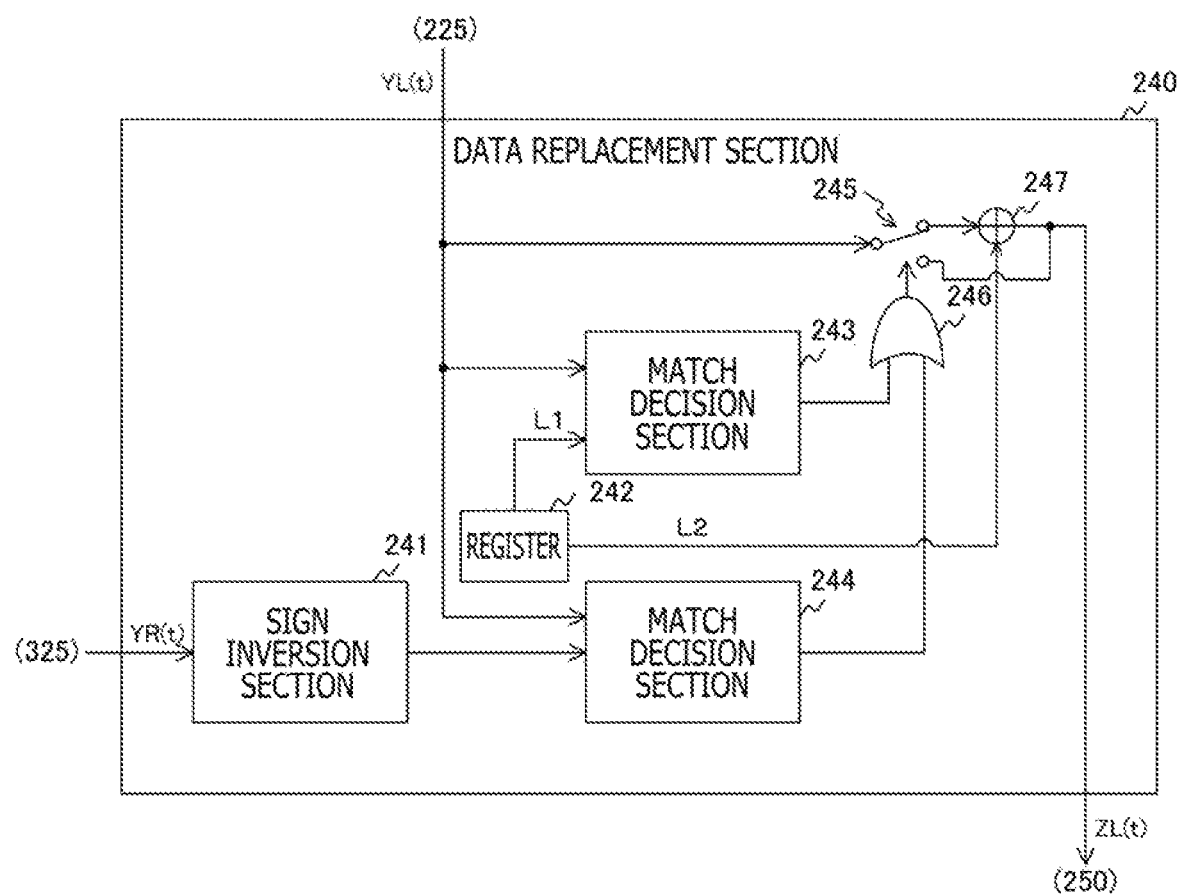
FIG. 17 is a block diagram illustrating a configuration example of the L-channel data replacement section in the second embodiment of the present technology.

FIG. 17 is a block diagram illustrating a configuration example of the L-channel data replacement section 240 in the second embodiment of the present technology. This data replacement section 240 includes a sign inversion section 241, a register 242, match decision sections 243 and 244, an OR (logical sum) gate 246, a switch 245, and an adder 247.

The sign inversion section 241 inverts the sign of the control data YR(t) and outputs the control data to the match decision section 244. The match decision section 244 decides whether or not −YR(t) from the sign inversion section 241 matches the control data YL(t) from the quantizer 225. This match decision section 244 supplies the decision result to the OR gate 246. In the case where −YR(t) and YL(t) match, for example, the decision result is set to "1," and in the case where the two do not match, the decision result is set to "0."

The register 242 retains the settings L1 and L2. The setting L1 is a value (e.g., "0") that leads to approximately the same pulse width for the L-channel positive-side pulse signal and negative-side pulse signal (i.e., simultaneous switching occurs). The setting L2 is a value (e.g., "1") other than "0" that is added to the control data YL(t).

The match decision section 243 decides whether or not the control data YL(t) from the quantizer 225 matches the setting L1. This match decision section 243 supplies the decision result to the OR gate 246. In the case where the control data YL(t) and the setting L1 match, for example, the decision result is set to "1," and in the case where the two do not match, the decision result is set to "0."

The OR gate 246 outputs, to the switch 245, a logical sum of the respective decision results of the match decision sections 243 and 244.

The switch 245 switches between destinations to which to output the control data YL(t) in response to the output signal of the OR gate 246. In the case where the output signal of the OR gate 246 is high, the switch 245 outputs the control data YL(t) to the adder 247 and, in the case where the output signal of the OR gate 246 is low, the switch 245 outputs the control data YL(t) as output data ZL(t).

The adder 247 adds the control data YL(t) from the switch 245 and the setting L2 together. This adder 247 outputs the result of addition as the output data ZL(t).

Figure 18:
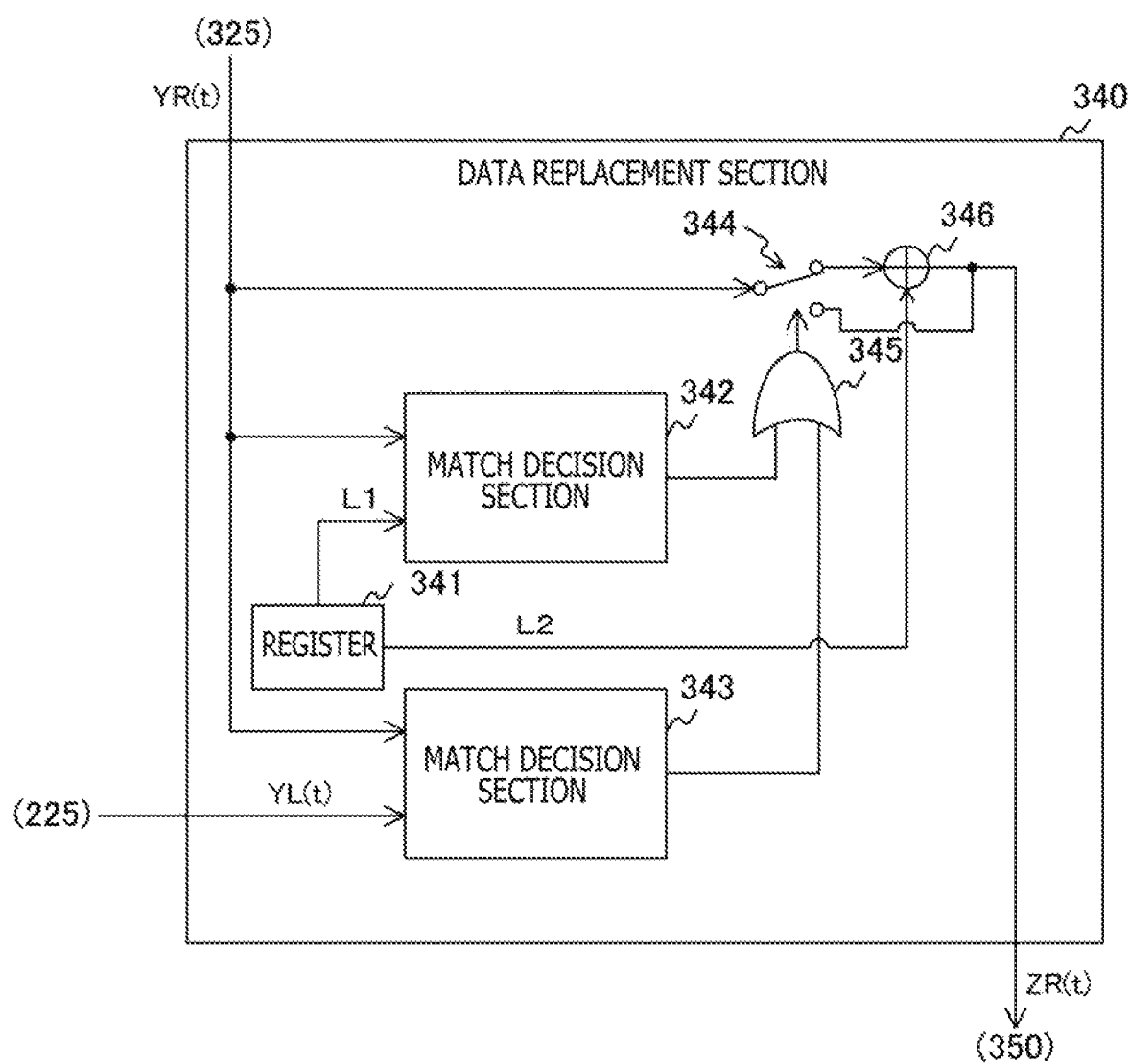
FIG. 18 is a block diagram illustrating a configuration example of the R-channel data replacement section in the second embodiment of the present technology.

FIG. 18 is a block diagram illustrating a configuration example of the R-channel data replacement section 340 in the second embodiment of the present technology. This data replacement section 340 includes a register 341, match decision sections 342 and 343, an OR gate 345, a switch 344, and an adder 346.

The register 341 retains the settings L1 and L2.

The match decision section 342 decides whether or not the control data YR(t) from the quantizer 325 matches the setting L1. This match decision section 342 supplies the decision result to the OR gate 345. In the case where the control data YR(t) and the setting L1 match, for example, the decision result is set to "1," and in the case where the two do not match, the decision result is set to "0."

The match decision section 343 decides whether or not the YR(t) from the quantizer 325 matches the control data YL(t) from the quantizer 225. This match decision section 343 supplies the decision result to the OR gate 345. In the case where YR(t) and YL(t) match, for example, the decision result is set to "1," and in the case where the two do not match, the decision result is set to "0."

The OR gate 345 outputs, to the switch 344, a logical sum of the respective decision results of the match decision sections 342 and 343.

The switch 344 switches between destinations to which to output the control data YR(t) in response to the output signal of the OR gate 345. In the case where the output signal of the OR gate 345 is high, the switch 344 outputs the control data YR(t) to the adder 346 and, in the case where the output signal of the OR gate 345 is low, the switch 344 outputs the control data YR(t) as output data ZR(t).

The adder 346 adds the control data YR(t) from the switch 344 and the setting L2 together. This adder 346 outputs the result of addition as the output data ZR(t).

FIGS. 19A and 19B represent diagrams illustrating an example of action of the data replacement sections 240 and 340 in the second embodiment of the present technology. FIG. 19A illustrates an example of action of the data replacement section 240, and FIG. 19B illustrates an example of action of the data replacement section 340.

Simultaneous switching occurs in the L channel when the control data YL(t) matches the setting L1 (e.g., "0") that leads to approximately the same pulse width for the positive and negative sides. Also, simultaneous switching occurs in the R channel when the control data YR(t) matches the setting L1. Further, simultaneous switching occurs in the L and R channels in the case where the absolute value of the control data YL(t) and the absolute value of the control data YR(t) match. In other words, simultaneous switching occurs when any one of the following four equations holds:

$$YL(t)==0 \quad \text{Equation 1}$$

$$YR(t)==0 \quad \text{Equation 2}$$

$$YL(t)==YR(t) \quad \text{Equation 3}$$

$$YL(t)==-YR(t) \quad \text{Equation 4}$$

When equation 1 holds, the data replacement section 240 replaces the control data YL(t) with a value that does not correspond to any of "0," YR(t) and −YR(t). When equation 2 holds, the data replacement section 340 replaces the control data YR(t) with a value that does not correspond to any of "0," YL(t) and −YL(t).

Also, when equation 3 or equation 4 holds, the data replacement section 240 or the data replacement section 340 handles the data replacement. In the case where the data replacement section 240 handles the data replacement, the control data YL(t) is replaced with a value that does not correspond to any of "0," YR(t), and −YR(t). In the case where the data replacement section 340 handles the data replacement, the control data YR(t) is replaced with a value that does not correspond to any of "0," YL(t), and −YL(t). In the case where none of equations 1 to 4 hold, the control data is output without being replaced.

As an example of the above control, for example, in the case where the control data YL(t) matches either "0" or −YR(t), the data replacement section 240 replaces the control data YL(t) with the sum of the control data YL(t) and the setting L2 and outputs the sum as the output data ZL(t).

On the other hand, in the case where the control data YL(t) does not match any of "0" and −YR(t), the data replacement section 240 outputs the control data YL(t) as the output data ZL(t).

Also, in the case where the control data YR(t) matches "0" or YL(t), the data replacement section 340 replaces the control data YR(t) with the sum of the control data YR(t) and the setting L2 and outputs the sum as the output data ZR(t).

On the other hand, in the case where the control data YR(t) does not match any of "0" and YL(t), the data replacement section 340 outputs the control data YR(t) as the output data ZR(t).

Figure 20:
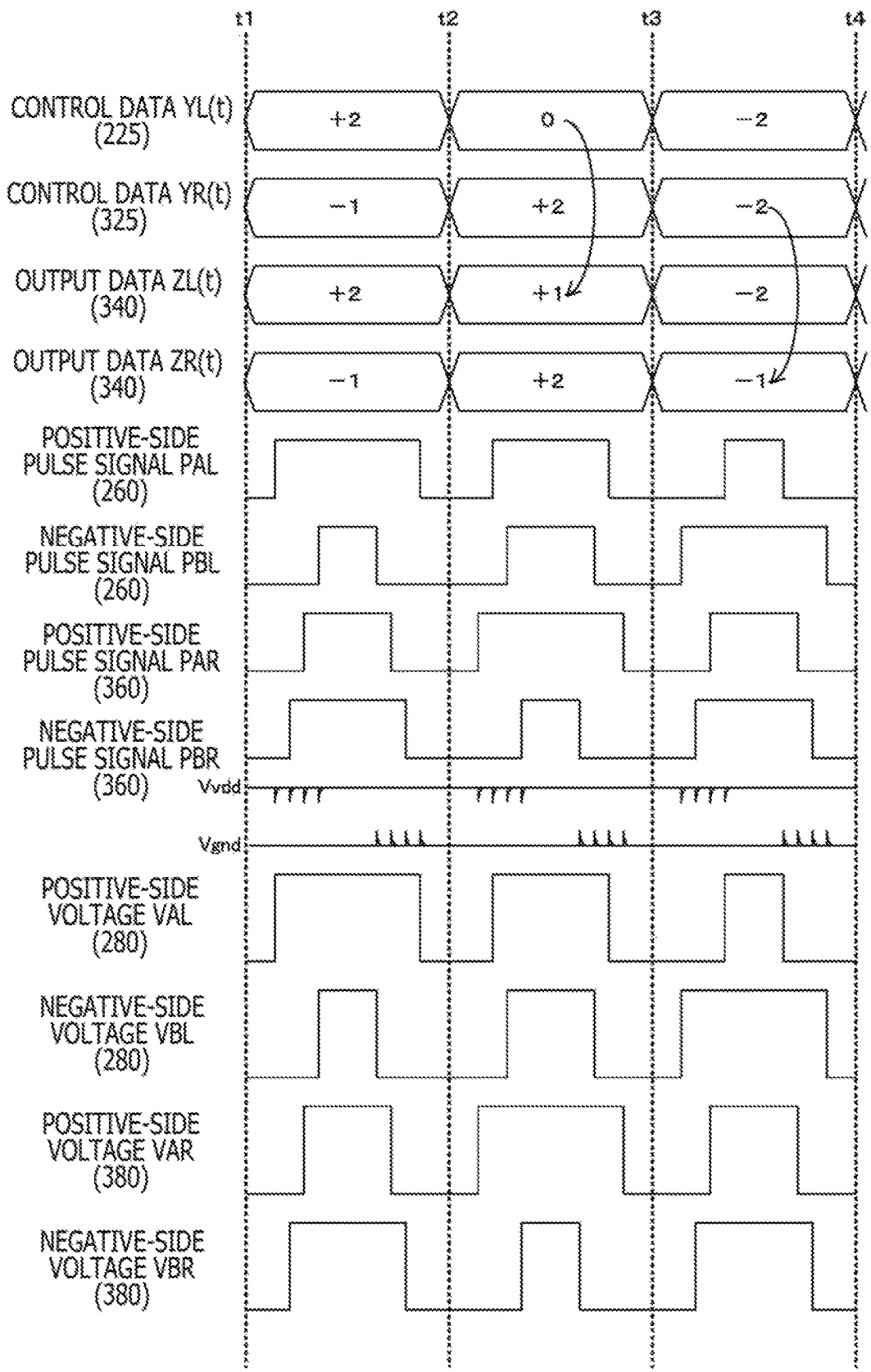

FIG. 20 is a timing chart illustrating examples of control data, output data, pulse signals, and voltage fluctuations in the second embodiment of the present technology.

In the L channel, control data with a value of "+2" is generated at time t1, and control data with a value of "0" is generated at time t2, and control data with a value of "−2" is generated at time t3. In the R channel, on the other hand, control data with a value of "−1" is generated at time t1, and control data with a value of "+2" is generated at time t2, and control data with a value of "−2" is generated at time t3.

Because the control data YL(t) matches "0" at time t2, the L-channel data replacement section 240 replaces the control data YL(t) with "+1" and outputs "+1" as the output data ZL(t). At times t1 and t3, the control data is not replaced in the L channel.

Also, because the control data YR(t) matches YL(t) at time t3, the R-channel data replacement section 340 replaces the control data YR(t) with "−1" and outputs "−1" as the output data ZR(t). At times t1 and t2, the control data is not replaced in the R channel.

The pulse width modulation circuits 250 and 350 modulate the pulse widths in accordance with the output data ZL(t) and ZR(t). Assuming that the data is not replaced in the L channel at time t2, the pulse widths of a positive-side signal PAL and a negative-side signal PBL become approximately the same, resulting in simultaneous switching. However, because the data replacement section 240 replaced the control data YL(t) with a value other than "0" at time t2, simultaneous switching does not occur.

Also, assuming that the data is not replaced at time t3, the pulse widths of the L and R channels become approximately the same, resulting in simultaneous switching in the L and R channels. However, because the data replacement section 340 replaced the control data YR(t) with a different value at time t3, simultaneous switching does not occur.

The pulse width modulation circuit 250 modulates the pulse width of each of the positive-side signal PAL and the negative-side signal PBL in accordance with the output data ZL(t). Also, the pulse width modulation circuit 350 modulates the pulse width of each of a positive-side pulse signal PAR and a negative-side pulse signal PBR in accordance with the output data ZR(t). The amplification section 260 amplifies the amplitude of each of the positive-side signal PAL and the negative-side signal PBL. The amplification section 360 amplifies the amplitude of each of the positive-side pulse signal PAR and the negative-side pulse signal PBR.

Here, the method in which the phase of the positive-side or negative-side pulse signal is shifted as described earlier results in an increased circuit scale and may lead to simultaneous switching when the signal level is relatively large. For example, if the control data YL(t) with a value of "+2" is input without any phase shift, this causes the positive-side pulse width to increase, delaying the falling edge of the positive-side pulse signal by M nanoseconds relative to the negative-side. If the negative-side pulse signal is shifted by M nanoseconds in this case, simultaneous switching does not occur when the control data YL(t) is, for example, "0." However, when the control data YL(t) is "+2," the positive-side and negative-side falling edges match, resulting in simultaneous switching.

However, the stereo power amplifier 300 only replaces data and does not shift any pulse signal phases, thereby preventing simultaneous switching even when the signal level is relatively large.

Thus, in the second embodiment of the present technology, the data replacement section 230 replaces control data that leads to approximately the same pulse width for the pair of pulse signals in the L and R channels, thus providing different edge timings for the pulse signals. This makes it possible to avoid simultaneous switching in the L and R channels, contributing to reduced noise on stereo audio signals.

FIRST MODIFICATION EXAMPLE

In the above second embodiment, the acoustic equipment 100 replaced only the L-channel and R-channel control data. In the acoustic equipment 100 that reproduces three or more channels of audio, however, more control data is generated than when two channels of audio are reproduced. Therefore, replacement of control data for two channels may not ensure noise reduction in the remaining channels. This acoustic equipment 100 of a first modification example of the second embodiment differs from the second embodiment in that it replaces control data in three or more channels.

Figure 21:
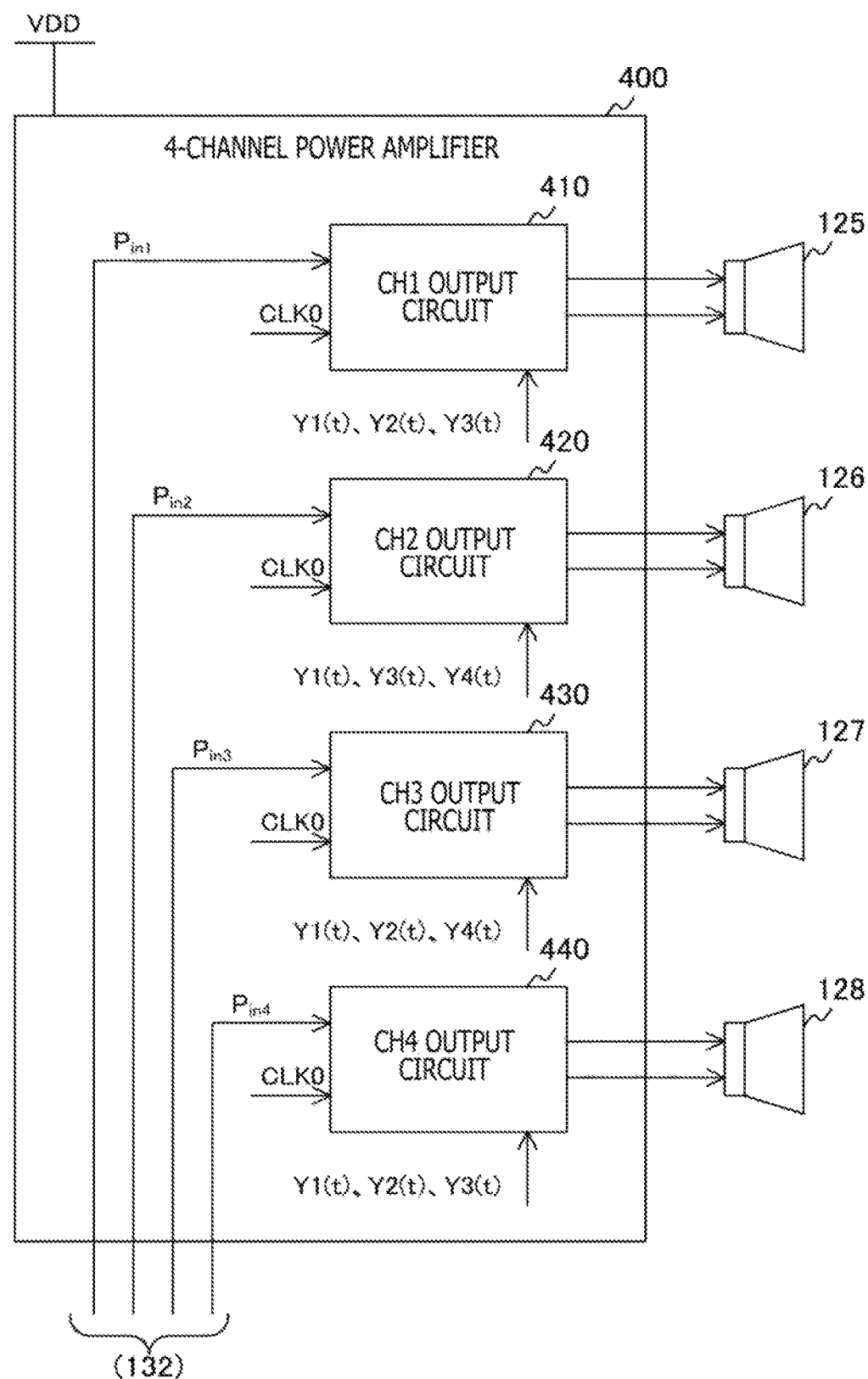

FIG. 21 is a block diagram illustrating a configuration example of a four-channel power amplifier 400 in the first modification example of the second embodiment of the present technology. This four-channel power amplifier 400 includes a CH1 output circuit 410, a CH2 output circuit 420, a CH3 output circuit 430, and a CH4 output circuit 440. Also, the four-channel power amplifier 400 is supplied with audio data $P_{in1}$, $P_{in2}$, $P_{in3}$, and $P_{in4}$ from an audio data supply section 132.

The audio data $P_{in1}$ is audio data of a channel CH1, and the audio data $P_{in2}$ is audio data of a channel CH2. Also, the audio data $P_{in3}$ is audio data of a channel CH3, and the audio data $P_{in4}$ is audio data of a channel CH4.

The CH1 output circuit 410 converts the audio data $P_{in1}$ into analog data through DA conversion and outputs the data to a monaural speaker 125. The CH2 output circuit 420 converts the audio data $P_{in2}$ into analog data through DA conversion and outputs the data to a monaural speaker 126. The CH3 output circuit 430 converts the audio data $P_{in3}$ into analog data through DA conversion and outputs the data to a monaural speaker 127. The CH4 output circuit 440 converts the audio data $P_{in4}$ into analog data through DA conversion and outputs the data to a monaural speaker 128. This circuit configuration is similar to that of the L-channel output circuit 201 of the second embodiment.

Also, the CH1 output circuit 410 generates control data Y1(t) of the channel CH1, and the CH2 output circuit 420 generates control data Y2(t) of the channel CH2. The CH3 output circuit 430 generates control data Y3(t) of the channel CH3, and the CH4 output circuit 440 generates control data Y4(t) of the channel CH4.

When the control data Y1(t) matches "0," the CH1 output circuit 410 replaces the control data Y1(t) with other data. When the control data Y2(t) matches "0," the CH2 output circuit 420 replaces the control data Y2(t) with other data. Similarly, when the control data Y3(t) matches "0," the CH3 output circuit 430 replaces the control data Y3(t) with other data. When the control data Y4(t) matches "0," the CH4 output circuit 440 replaces the control data Y4(t) with other data.

Also, data replacement takes place when at least two of the absolute values of the control data Y1(t), Y2(t), Y3(t), and Y4(t) match. For example, when Y1(t) matches +Y2(t) or −Y2(t), one of the CH1 output circuit 410 and the CH2 output circuit 420 replaces corresponding control data with other data.

It should be noted that although four audio signal channels are used, the number of channels is not limited to four, and there may be three channels or five or more channels.

Thus, in the first modification example of the second embodiment of the present technology, the output circuit 410, for example, replaces control data that leads to approximately the same pulse width for pulse signals in the four channels, thus providing different edge timings for the pulse signals. This makes it possible to avoid simultaneous switching in the four channels, thus permitting reduction in noise on the four-channel audio signals.

SECOND MODIFICATION EXAMPLE

In the above second embodiment, the stereo power amplifier 300 output, for each channel, a differential pulse signal that included a pair of pulse signals (produced differential outputs). However, in the case of a differential output, two signal lines are required for each channel to transmit pulse signals. Therefore, as the number of channels increases, the number of signal lines increases. In order to reduce the number of signal lines, it is sufficient if the power amplifier outputs a single pulse signal for each channel (produces a single output). The acoustic equipment 100 of this second modification example of the second embodiment differs from the second embodiment in that it produces a single output of pulse signals.

Figure 22:
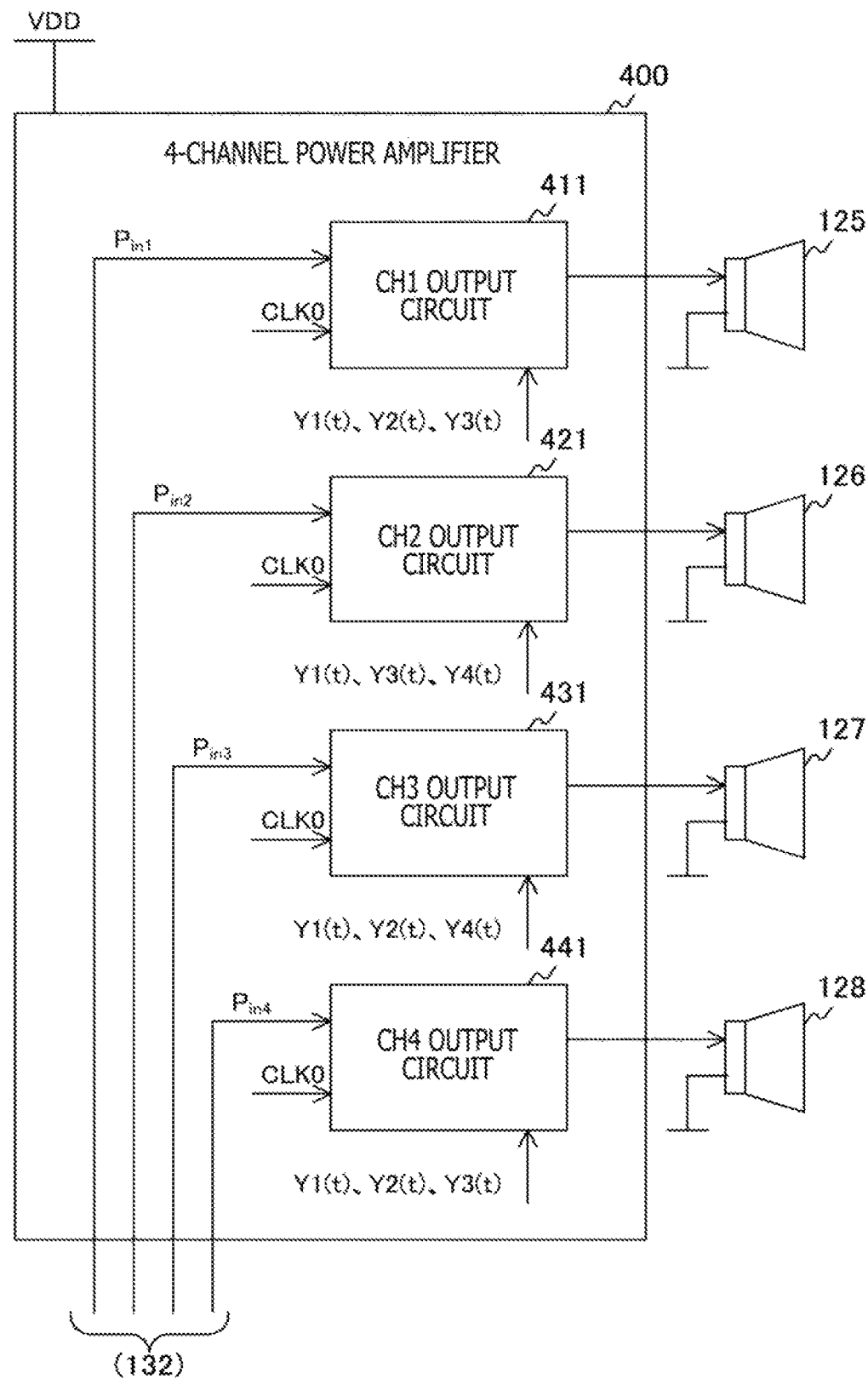

FIG. 22 is a block diagram illustrating a configuration example of the four-channel power amplifier 400 in the second modification example of the second embodiment of the present technology. This four-channel power amplifier 400 includes a CH1 output circuit 411, a CH2 output circuit 421, a CH3 output circuit 431, and a CH4 output circuit 441. Also, the four-channel power amplifier 400 is supplied with the audio data $P_{in1}$, $P_{in2}$, $P_{in3}$, and $P_{in4}$ from the audio data supply section 132.

The audio data $P_{in1}$ is audio data of the channel CH1, and the audio data $P_{in2}$ is audio data of the channel CH2. Also, the audio data $P_{in3}$ is audio data of the channel CH3, and the audio data $P_{in4}$ is audio data of the channel CH4.

The CH1 output circuit 411 converts the audio data $P_{in1}$ into analog data through DA conversion and outputs the data to the monaural speaker 125. This CH1 output circuit 411 generates the control data Y1(t) of the channel CH1 by delta-sigma modulating the audio data $P_{in1}$. This control data Y1(t) represents the pulse width of the pulse signal. Then, the CH1 output circuit 411 modulates the pulse width of the pulse signal in accordance with the control data Y1(t), amplifies the pulse signal using a switching amplifier, and outputs the signal to the monaural speaker 125.

The CH2 output circuit 421 converts the audio data $P_{in2}$ into analog data through a process similar to that of the CH1 output circuit 411 and outputs the data to the monaural speaker 126. The CH3 output circuit 431 converts the audio data $P_{in3}$ into analog data through DA conversion and outputs the data to the monaural speaker 127. The CH4 output circuit 441 converts the audio data $P_{in4}$ into analog data through DA conversion and outputs the data to the monaural speaker 128.

Also, the CH2 output circuit 421 generates the control data Y2(t) of the channel CH2. The CH3 output circuit 431 generates the control data Y3(t) of the channel CH3, and the CH4 output circuit 441 generates the control data Y4(t) of the channel CH4.

Also, data replacement takes place when at least two of the absolute values of the control data Y1(t), Y2(t), Y3(t), and Y4(t) match. For example, when Y1(t) matches +Y2(t) or −Y2(t), one of the CH1 output circuit 411 and the CH2 output circuit 421 replaces corresponding control data with other data.

It should be noted that although four audio signal channels are used, the number of channels is not limited to four as long as the number is two or more, and there may be three channels or five or more channels.

Thus, in the second modification example of the second embodiment of the present technology, the output circuit 411, for example, replaces control data that leads to approximately the same pulse width for a plurality of single output pulse signals, thus providing different edge timings for the pulse signals. This makes it possible to reduce noise caused by switching. Also, single outputs permit reduction in number of signal lines used to transmit pulse signals.

<Application Example to Mobile Body>

The technology according to the present disclosure (the present technology) is applicable to a variety of products. For example, the technology according to the present disclosure may be realized as an apparatus mounted to any kind of mobile bodies such as automobile, electric vehicle, hybrid electric vehicle, two-wheeled motor vehicle, bicycle, personal mobility, airplane, drone, ship, and robot.

Figure 23:
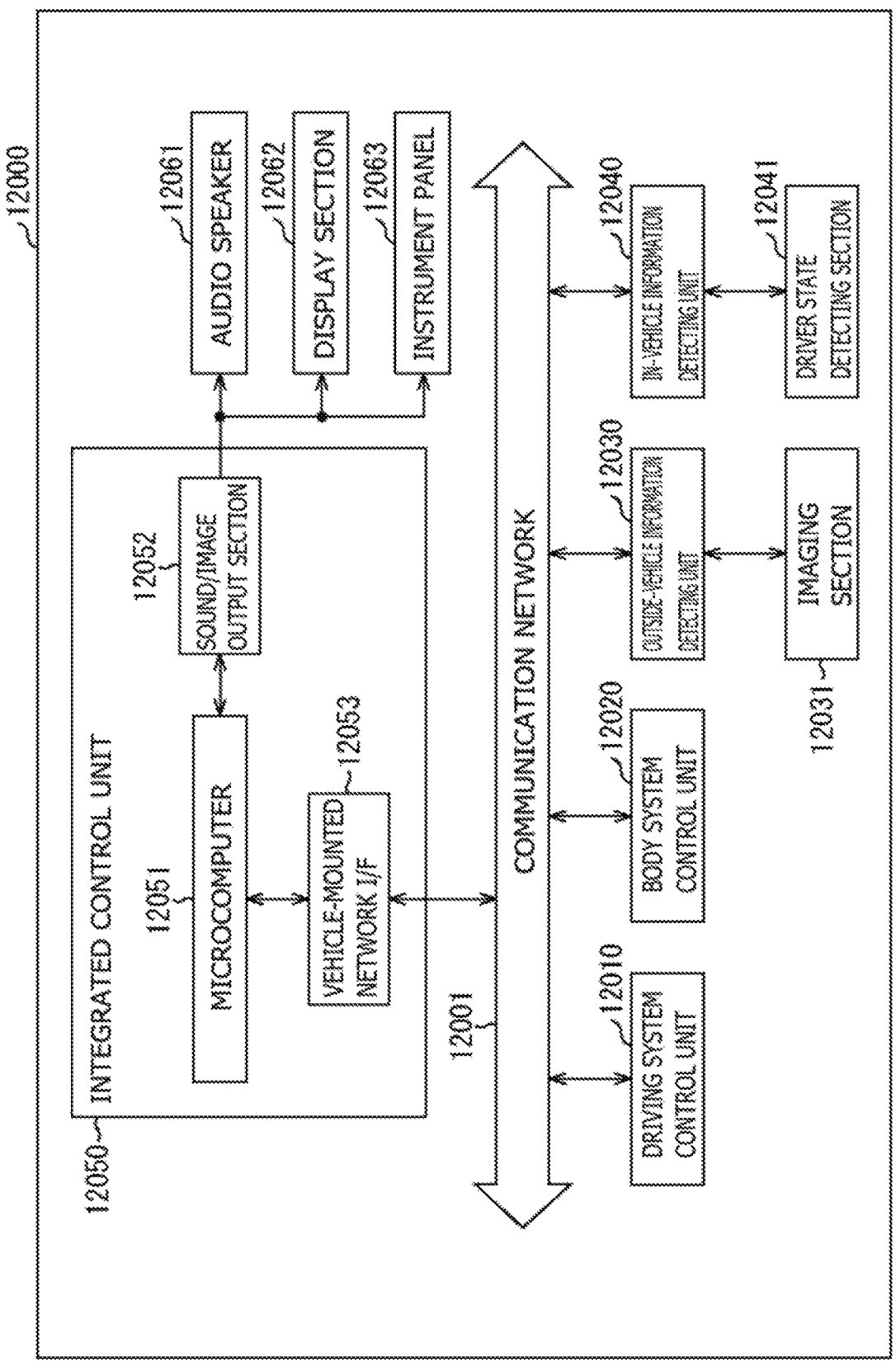

FIG. 23 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 23, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 23, an audio speaker 12061, a display section 12062, and an instrument panel 12063 are illustrated as the output device. The display section 12062 may, for example, include at least one of an on-board display and a head-up display.

Figure 24:
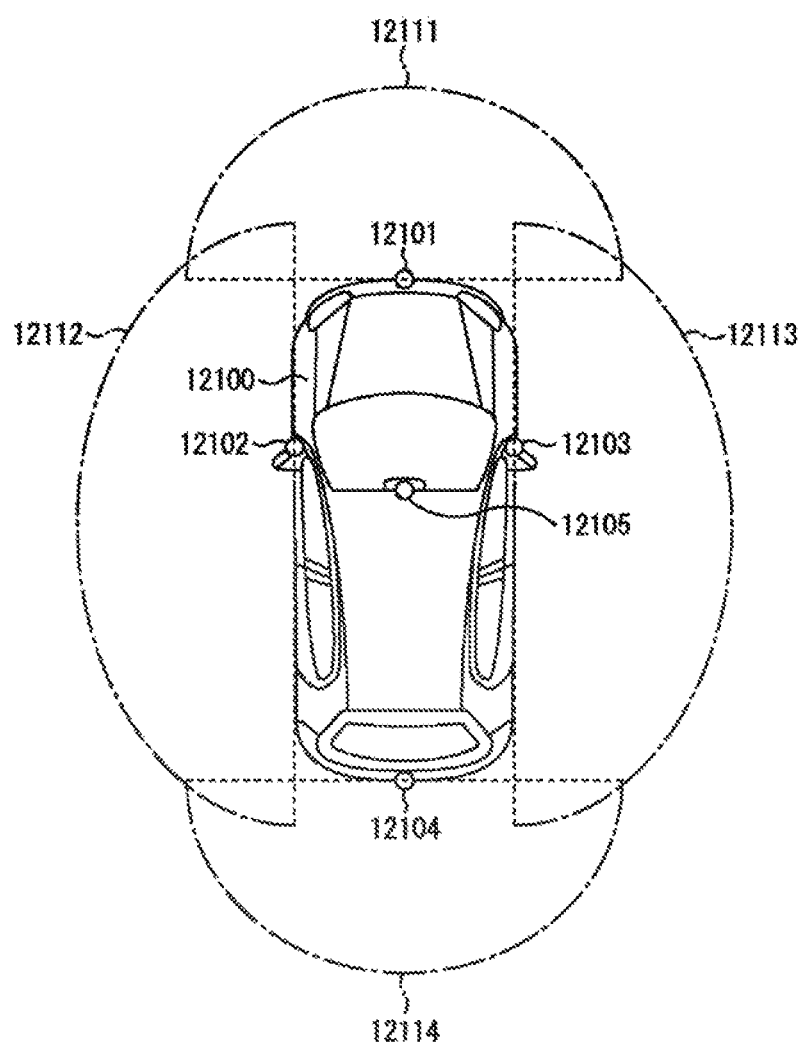

FIG. 24 is a diagram depicting an example of the installation position of the imaging section 12031.

In FIG. 24, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

FIG. 24 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

A description has been given above of an example of a vehicle control system to which the technology according to the present disclosure is applicable. The technology according to the present disclosure is applicable, of the components described above, to the power amplifier provided in the sound/image output section 7660. The audio signal quality can be improved with a simple configuration by applying the technology according to the present disclosure to the power amplifier provided in the sound/image output section 7660.

It should be noted that the above embodiments depict examples for realizing the present technology, and the matters in the embodiments and the matters specifying the invention in the scope of claims are respectively in correspondence with each other. Similarly, the matters specifying the invention in the scope of claims and the matters in the embodiments of the present technology denoted by the same names are respectively in correspondence with each other. It should be noted that the present technology is not limited to the embodiments and can be modified in various ways without departing from the gist thereof.

Also, processing procedures described in the above embodiment may be construed as a method having a series of these procedures and may also be construed as a program for causing a computer to perform the series of procedures or as a recording medium for recording the program. A CD (Compact Disc), an MD (MiniDisc), a DVD (Digital Versatile Disc), a memory card, a Blu-ray (registered trademark) disc, or the like can be used as this recording medium.

It should be noted that the effect described in the present specification is merely illustrative and not restrictive and that there may be other effects.

It should be noted that the present technology can have the following configurations.

(1) A control circuit including:
a control data output section configured to output control data that instructs that a pulse width of each of a pair of pulse signals be modulated;
a data replacement section configured to replace the control data with data for replacement different from the control data in the case where the control data is output that instructs that the modulation leading to approximately the same pulse width for the pair of pulse signals be performed;
a pulse width modulation circuit configured to perform the modulation on each of the pair of pulse signals in accordance with the data for replacement; and
a pair of switching amplifiers configured to amplify the pair of pulse signals that have been subjected to the modulation.

(2) The control circuit of feature (1), further including:
a difference operator configured to output a difference between input data and feedback data as difference data;
an integration circuit configured to generate integral data by integrating the difference data; and
a delay section configured to delay the data for replacement and feed back the delayed data for replacement to the difference operator as the feedback data, in which
the input data is quantized data, and
the control data output section re-quantizes the integral data and outputs the re-quantized data to the data replacement section as the control data.

(3) The control circuit of feature (1) or (2), in which
the control data represents a difference in pulse width between the pair of pulse signals, and
the data replacement section replaces the control data with the data for replacement in the case where the control data is output that instructs that the modulation approximately nulling the difference be performed.

(4) The control circuit of feature (3), in which
the pair of switching amplifiers are provided for all of a plurality of output circuits outputting audio of different channels.

(5) The control circuit of feature (4), in which
the plurality of output circuits include a left-channel output circuit outputting left-channel audio and a right-channel output circuit outputting right-channel audio.

(6) The control circuit of feature (1), in which
the control data represents the pulse width of each of the pair of pulse signals, one of the pair of switching amplifiers is provided in one of a plurality of output circuits outputting audio of different channels, and
an other of the pair of switching amplifiers is provided in an output circuit of the plurality of output circuits where the one of the pair of switching amplifiers is not provided.

(7) The control circuit of any one of features (1) to (6), in which
the data replacement section outputs the control data to the pulse width modulation circuit in the case where the control data is output that instructs that the modulation leading to approximately the same pulse width for the pair of pulse signals be performed, and
the pulse width modulation circuit performs the modulation in accordance with the data for replacement or the control data.

(8) A control method of a control circuit, the control method including:
a control data output procedure of outputting control data that instructs that a pulse width of each of a pair of pulse signals be modulated;
a data replacement procedure of replacing the control data with data for replacement different from the control data in the case where the control data is output that instructs that the modulation leading to approximately the same pulse width for the pair of pulse signals be performed;
a pulse width modulation procedure of performing the modulation on each of the pair of pulse signals in accordance with the data for replacement; and
an amplification procedure of amplifying, by a pair of switching amplifiers, the pair of pulse signals that have been subjected to the modulation.

REFERENCE SIGNS LIST 100, 101: Acoustic equipment
110: Power supply circuit
120, 125, 126, 127, 128: Monaural speaker
121: Impedance
122: Stereo speaker
130, 131, 132: Audio data supply section
200: Monaural power amplifier
201: L-channel output circuit
210: Frequency divider
220, 320: Delta-sigma modulator
221, 223, 247, 321, 323, 346: Adder
222: Integration circuit
224, 226, 324, 326: Delay section
225, 325: Quantizer
230, 240, 340: Data replacement section
231, 242, 341: Register
232, 243, 244, 342, 343: Match decision section
233: Selector
241: Sign inversion section
245, 344: Switch
246, 345: OR (logical sum) gate
250, 350: Pulse width modulation circuit
251: DA converter
252: Carrier signal generation section
253: Positive-side comparator
254: Negative-side comparator
260, 360: Amplification section
261: Positive-side switching amplifier
262, 264, 267, 269: Driver
263, 265, 268, 270: Drive transistor
266: Negative-side switching amplifier
271, 272: Parasitic impedance 280, 380: Low-pass filter
281, 283: Inductor
282, 284: Capacitor
300: Stereo power amplifier
301: R-channel output circuit
400: Four-channel power amplifier
410, 411: CH1 output circuit
420, 421: CH2 output circuit
430, 431: CH3 output circuit
440, 441: CH4 output circuit
7670: Sound/image output section

The invention claimed is:
1. A control circuit, comprising:
a control data output section configured to output control data that instructs to perform modulation on a pulse width of each pulse signal of a pair of pulse signals;
a data replacement section comprising:
a buffer configured to hold a first setting and a second setting, wherein
the first setting is a first value of the control data that instructs to perform the modulation which leads to approximately a same pulse width for a first pulse signal of the pair of pulse signals and a second pulse signal of the pair of pulse signals, and
the second setting is a second value different from the first value of the first setting;
match decision section configured to determine a match between the control data and the first setting; and
a selector configured to select one of the control data or the second setting based on a result of the determination of the match between the control data and the first setting, wherein
based on the result of the determination of the match between the control data and the first setting indicating a match between the control data and the first setting, the selector is further configured to:
select the second setting;
replace the control data with the second setting as data for replacement; and
output the data for replacement;
a pulse width modulation circuit configured to perform the modulation on each pulse signal of the pair of pulse signals based on the data for replacement; and
a pair of switching amplifiers configured to amplify the pair of pulse signals that have been subjected to the modulation.
2. The control circuit of claim 1, further comprising:
a difference operator configured to output a difference between input data and feedback data as difference data;
an integration circuit configured to generate integral data based on integration of the difference data; and
a delay section configured to:
delay the data for replacement; and
feed back the delayed data for replacement to the difference operator as the feedback data, wherein
the input data is quantized data, and
the control data output section is further configured to:
re-quantize the integral data; and
output the re-quantized integral data to the data replacement section as the control data.
3. The control circuit of claim 1, wherein
the control data represents a difference in pulse width between the first pulse signal and the second pulse signal of the pair of pulse signals, and the data replacement section is further configured to replace the control data with the data for replacement based on output of the control data is that instructs to perform the modulation that approximately nulls the difference in the pulse width between the first pulse signal and the second pulse signal of the pair of pulse signals.
4. The control circuit of claim 3, wherein the pair of switching amplifiers are provided for all of a plurality of output circuits configured to output audio of different channels.
5. The control circuit of claim 4, wherein the plurality of output circuits includes a left-channel output circuit configured to output a left-channel audio and a right-channel output circuit configured to output a right-channel audio.
6. The control circuit of claim 5, wherein the data replacement section is further configured to replace the control data of one of a left-channel or a right-channel with the data for replacement based on a match between an absolute value of the control data of the left-channel and an absolute value of the control data of the right-channel.
7. The control circuit of claim 1, wherein
the control data represents the pulse width of each of the first pulse signal and the second pulse signal of the pair of pulse signals,
a first switching amplifier of the pair of switching amplifiers is provided in a first output circuit of a plurality of output circuits configured to output audio of different channels,
a second switching amplifier of the pair of switching amplifiers is provided in a second output circuit of the plurality of output circuits, and
the second output circuit is different from the first output circuit where the first switching amplifier of the pair of switching amplifiers is provided.
8. The control circuit of claim 1, wherein based on the result of the determination of the match between the control data and the first setting indicating a mismatch between the control data and the first setting, the selector is further configured to:
select the control data; and
output the control data to the pulse width modulation circuit, and
the pulse width modulation circuit is further configured to perform the modulation based on the control data.
9. A control method of a control circuit, the control method comprising:
outputting control data that instructs to perform modulation on a pulse width of each pulse signal of a pair of pulse signals;
determining a match between the control data and a first setting, wherein the first setting is a first value of the control data that instructs to perform the modulation which leads to approximately a same pulse width for a first pulse signal of the pair of pulse signals and a second pulse signal of the pair of pulse signals;
selecting one of the control data or a second setting based on a result of the determination of the match between the control data and the first setting, wherein the second setting is a second value different from the first value of the first setting;
based on the result of the determination of the match between the control data and the first setting indicating a match between the control data and the first setting, replacing the control data with the second setting as data for replacement;
outputting the data for replacement;

performing the modulation on each pulse signal of the pair of pulse signals based on the data for replacement; and amplifying, by a pair of switching amplifiers, the pair of pulse signals that have been subjected to the modulation.

* * * * *